US008169059B2

(12) United States Patent
Barth et al.

(10) Patent No.: US 8,169,059 B2
(45) Date of Patent: May 1, 2012

(54) ON-CHIP RF SHIELDS WITH THROUGH SUBSTRATE CONDUCTORS

(75) Inventors: Hans-Joachim Barth, Munich (DE); Jens Pohl, Bernhardswald (DE); Gottfried Beer, Nittendorf (DE); Oliver Nagy, Vienna (AT)

(73) Assignee: Infineon Technologies AG, Neubiberg (DE)

( * ) Notice: Subject to any disclaimer, the term of this patent is extended or adjusted under 35 U.S.C. 154(b) by 499 days.

(21) Appl. No.: 12/242,521

(22) Filed: Sep. 30, 2008

(65) Prior Publication Data

US 2010/0078771 A1 Apr. 1, 2010

(51) Int. Cl.
*H01L 23/552* (2006.01)
(52) U.S. Cl. ........ 257/659; 257/508; 257/531; 257/547; 257/621; 257/690; 257/E21.497; 257/E21.536; 257/E21.476; 257/E23.18; 257/E23.114; 438/121; 438/381; 438/655; 438/667; 361/818
(58) Field of Classification Search .................. 438/637, 438/121, 381, 655, 667; 257/508, 621, 659, 257/531, 690, E23.18, E23.114, E21.497, 257/E21.536, E21.476; 174/255, 262; 361/818
See application file for complete search history.

(56) References Cited

U.S. PATENT DOCUMENTS

| 5,151,770 | A | * | 9/1992 | Inoue | 257/660 |
|---|---|---|---|---|---|
| 5,196,920 | A | * | 3/1993 | Kumamoto et al. | 257/798 |
| 5,202,754 | A |  | 4/1993 | Bertin et al. |  |
| 5,272,098 | A |  | 12/1993 | Smayling et al. |  |
| 5,475,255 | A | * | 12/1995 | Joardar et al. | 257/547 |
| 5,500,789 | A | * | 3/1996 | Miller et al. | 361/816 |
| 5,955,789 | A |  | 9/1999 | Vendramin |  |
| 6,307,252 | B1 | * | 10/2001 | Knoedl, Jr. | 257/659 |
| 6,486,534 | B1 |  | 11/2002 | Sridharan et al. |  |
| 6,548,391 | B1 |  | 4/2003 | Ramm et al. |  |
| 6,618,267 | B1 |  | 9/2003 | Dalal et al. |  |
| 6,686,649 | B1 | * | 2/2004 | Mathews et al. | 257/659 |
| 6,888,063 | B1 | * | 5/2005 | Lien et al. | 174/394 |
| 6,947,295 | B2 |  | 9/2005 | Hsieh |  |
| 6,982,477 | B2 | * | 1/2006 | Adan | 257/659 |
| 7,033,927 | B2 | * | 4/2006 | Cohen et al. | 438/637 |
| 7,049,682 | B1 |  | 5/2006 | Mathews et al. |  |
| 7,079,086 | B2 | * | 7/2006 | Aisenbrey | 343/872 |
| 7,371,977 | B1 | * | 5/2008 | Preonas | 174/383 |
| 7,427,803 | B2 | * | 9/2008 | Chao et al. | 257/659 |
| 7,439,621 | B1 | * | 10/2008 | Ishida et al. | 257/728 |
| 7,545,662 | B2 | * | 6/2009 | Wang et al. | 365/53 |
| 7,619,297 | B2 | * | 11/2009 | Wang | 257/531 |
| 7,629,674 | B1 | * | 12/2009 | Foster | 257/659 |
| 7,745,910 | B1 | * | 6/2010 | Olson et al. | 257/659 |

(Continued)

FOREIGN PATENT DOCUMENTS

DE 10 2004 022 884 A1 12/2005

*Primary Examiner* — Victor A Mandala
*Assistant Examiner* — William Harriston
(74) *Attorney, Agent, or Firm* — Slater & Matsil, L.L.P.

(57) ABSTRACT

Structures of a system on chip and methods of forming a system on chip are disclosed. In one embodiment, the system on a chip includes an RF component disposed on a first part of a substrate, a semiconductor component disposed on a second part of the substrate, the semiconductor component and the RF component sharing a common boundary. The system on chip further includes through substrate conductors disposed in the substrate, the through substrate conductors coupled to a ground potential node, the through substrate conductors disposed around the RF component forming a fence around the RF circuit.

42 Claims, 21 Drawing Sheets

U.S. PATENT DOCUMENTS

| | | | |
|---|---|---|---|
| 7,821,110 B2 * | 10/2010 | Kim et al. ............... | 257/659 |
| 7,936,052 B2 | 5/2011 | Barth et al. | |
| 7,948,064 B2 | 5/2011 | Barth et al. | |
| 2001/0052645 A1 | 12/2001 | Op'T Eynde et al. | |
| 2002/0167071 A1 | 11/2002 | Wang | |
| 2003/0003724 A1 | 1/2003 | Uchiyama et al. | |
| 2004/0195591 A1 | 10/2004 | Gehman et al. | |
| 2005/0135727 A1 | 6/2005 | Piede et al. | |
| 2005/0233581 A1 | 10/2005 | Soejima et al. | |
| 2005/0282381 A1 * | 12/2005 | Cohen et al. ............. | 438/637 |
| 2006/0027934 A1 | 2/2006 | Edelstein et al. | |
| 2006/0186513 A1 | 8/2006 | Kitaguchi | |
| 2006/0192265 A1 | 8/2006 | Hsu | |
| 2006/0197214 A1 | 9/2006 | Chen | |
| 2006/0220178 A1 | 10/2006 | Kubo et al. | |
| 2006/0229683 A1 | 10/2006 | Wang et al. | |
| 2007/0023203 A1 * | 2/2007 | Leizerovich et al. ...... | 174/255 |
| 2007/0262422 A1 * | 11/2007 | Bakalski et al. ........... | 257/659 |
| 2007/0281438 A1 * | 12/2007 | Liu et al. ................... | 438/455 |
| 2008/0064189 A1 | 3/2008 | Daubenspeck et al. | |
| 2008/0073747 A1 * | 3/2008 | Chao et al. ................. | 257/520 |
| 2008/0073752 A1 | 3/2008 | Asai et al. | |
| 2008/0116541 A1 * | 5/2008 | Erturk et al. ............... | 257/531 |
| 2008/0157341 A1 | 7/2008 | Yang et al. | |
| 2009/0302438 A1 * | 12/2009 | Chauhan et al. ........... | 257/659 |
| 2010/0078776 A1 * | 4/2010 | Barth et al. ................ | 257/659 |
| 2010/0078777 A1 | 4/2010 | Barth et al. | |
| 2010/0078778 A1 | 4/2010 | Barth et al. | |
| 2010/0078779 A1 * | 4/2010 | Barth et al. ................ | 257/659 |
| 2010/0127376 A1 * | 5/2010 | Karim et al. ............... | 257/690 |
| 2011/0201175 A1 | 8/2011 | Barth et al. | |

* cited by examiner

ON-CHIP RF SHIELDS WITH THROUGH SUBSTRATE CONDUCTORS

CROSS-REFERENCE TO RELATED APPLICATIONS

This patent application relates to the following commonly assigned applications concurrently filed, each of which is hereby incorporated herein by reference:

| U.S. Pat. No. | Ser. No. | Filing Date | Issue Date |
|---|---|---|---|
| 7,948,064 | 12/242,698 | Sep. 30, 2008 | May 24, 2011 |
| 7,936,052 | 12/242,487 | Sep. 30, 2008 | May 3, 2011 |
|  | 12/242,688 | Sep. 30, 2008 |  |
| 8,063,469 | 12/242,556 | Sep. 30, 2008 | Nov. 22, 2011 |

TECHNICAL FIELD

This invention relates generally to electronic devices, and more particularly to RF shields with through substrate conductors.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a demand in semiconductor device technology to integrate many different functions on a single chip, e.g., manufacturing analog and digital circuitry on the same die. In such applications, many different components such as digital and analog or RF circuitry are integrated into a single chip. However such integration creates additional challenges that need to be overcome. For example, integration of multiple components results in interference between various components. RF circuits operating at high frequencies produce extraneous electromagnetic radiation that interferes with the operation of other components in the integrated system on chip. This problem is getting worse with subsequent technology generations as operating frequencies continuously increase. Aggressive integration of multiple components in a single chip requires the need to eliminate such interference without a significant increase in production costs.

SUMMARY OF THE INVENTION

These and other problems are generally solved or circumvented, and technical advantages are generally achieved, by embodiments of the present invention.

Embodiments of the invention include structures for shielding semiconductor components on a system on chip comprising an RF component from electromagnetic radiation originating from the RF circuitry of the RF component. In accordance with an embodiment of the present invention, the system on the chip comprises an RF component disposed on a first part of a substrate, a semiconductor component disposed on a second part of the substrate, the semiconductor component and the RF component sharing a common boundary. The system on chip further comprises through substrate conductors disposed in the substrate, the through substrate conductors coupled to a ground potential node, the through substrate conductors disposed around the RF component forming a fence around the RF circuit.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1a-1h, illustrates through substrate conductors forming an RF shield around the RF component, wherein FIGS. 1a-1d illustrate through substrate vias, and FIGS. 1e-1h illustrate through substrate lines, in accordance with embodiments of the invention;

FIG. 2, which includes

FIG. 3, which includes

FIG. 5, which includes

FIG. 7, which includes

FIG. 9 which includes FIGS. 9a-9d, illustrates a cross-section of a through substrate conductor in various stages of fabrication, wherein FIGS. 9a and 9b illustrate the through substrate conductor during fabrication, in accordance with an embodiment of the invention, and FIGS. 9c and 9d illustrate top cross-sectional views of two different embodiments illustrated in FIG. 9b;

FIG. 11, which includes FIGS. 11a and 11b, illustrates two types of through substrate conductors forming an RF shield, wherein FIG. 11a illustrates a top view and FIG. 11b illustrates a cross-sectional view of the through substrate conductors.

Corresponding numerals and symbols in the different figures generally refer to corresponding parts unless otherwise

DETAILED DESCRIPTION OF ILLUSTRATIVE EMBODIMENTS

Figure 1A:
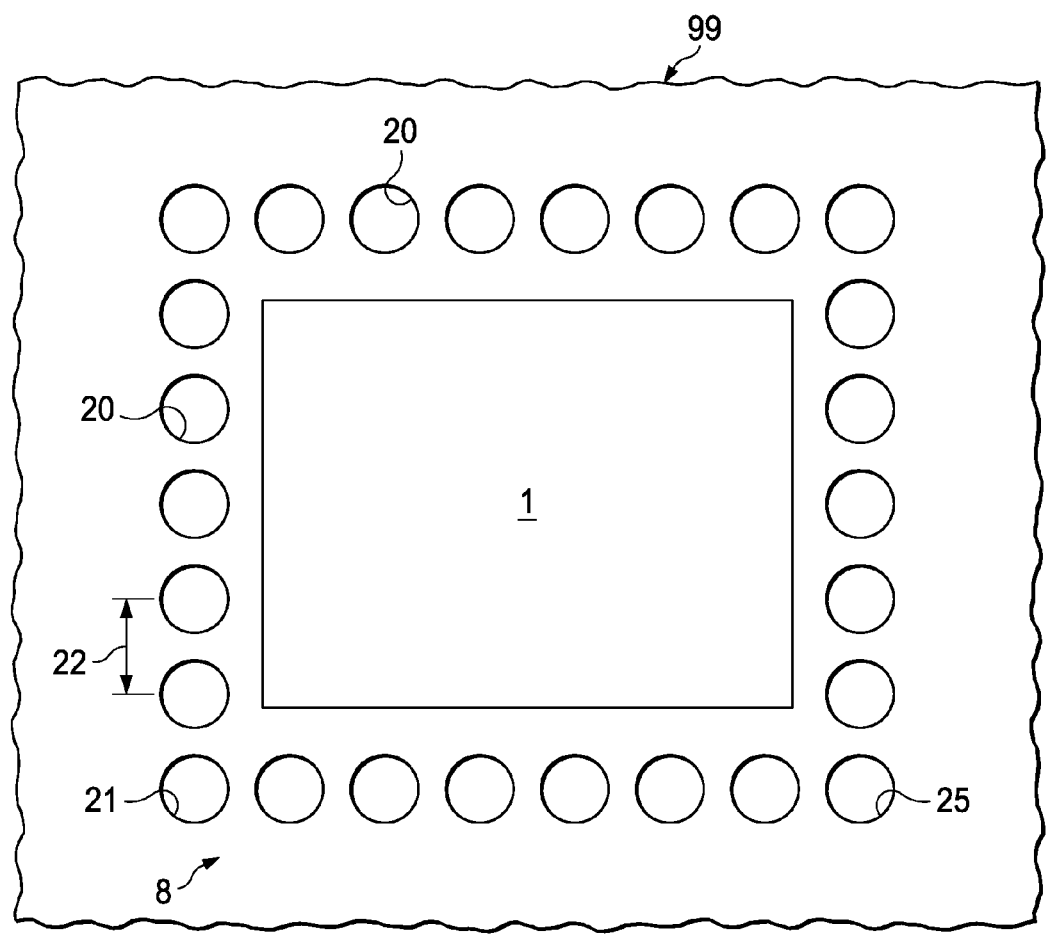

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure comprising through substrate vias forming an RF shield, and methods of forming the RF shield comprising the through substrate vias. In various embodiments, the invention avoids the use of separate shielding layers disposed outside the chip (for example, during packaging). The present invention avoids expensive fabrication costs by integrating the RF shield on-chip rather than being separately attached to the chip. Further, being an integrated RF shield, the manufacturing steps are commonly shared with other components already being used in the fabrication of the system on chip (SoC). Although illustrated with respect to shielding adjacent components on an SoC, the invention may be applied to shielding single chips from adjacent chips.

According to SoC requirements, analog, RF, digital, and memory blocks must all coexist on-chip while interacting minimally (such as generating minimal noise and being highly immune to the received noise). In particular, as operating frequencies increase with scaling, RF components operating at high GHz frequencies emit electromagnetic radiation that interferes with other neighboring components. In various embodiments of the present invention, a conductive shield surrounds the RF components to minimize this interference. The conductive shield blocks out the electromagnetic radiation generated by the RF circuitry from reaching other components of the SoC.

A structural embodiment of the invention illustrating a top view of a conductive cage will be first described using FIG. 1. Further structural embodiments will be described using FIGS. 2, 11 and 12. Embodiments of methods of fabrication of through substrate conductors will be illustrated in FIGS. 3, 5, and 9 and flow charts of FIGS. 4, 6, 8, and 10.

An embodiment of the invention is illustrated in FIG. 1. The SoC chip 99 illustrated in FIG. 1 comprises an RF circuit or an RF component 1 along with other components. In one embodiment, the SoC chip 99 comprises digital logic component, analog component, non-volatile memory, SRAM component and DRAM component. In various embodiments, less or more components may be present.

In various embodiments, electromagnetic radiation emitted by the RF component 1 is shielded by an RF shield 8. The RF shield 8, in one embodiment, comprises vertical sections (vertical fence 20) passing through the substrate 10. In various embodiments, the RF shield 8 comprises through substrate conductors 25 electrically coupled to a node coupled to a ground potential. The through substrate conductors 25 may comprise different shapes and be arranged to minimize fabrication costs while maximizing the electromagnetic shielding.

The through substrate conductors forming the vertical fence 20 of the RF shield 8 are described in FIG. 1 in accordance with an embodiment of the invention. FIGS. 1a-1d illustrate through substrate vias 21 forming the fence 20, whereas, FIGS. 1e-1g illustrate through substrate trenches 24.

Referring to FIG. 1a, through substrate vias 21 are arranged around the perimeter or periphery of the RF circuit 1. The through substrate vias 21 are spaced apart by a distance (pitch 22) of about 300 µm or less. In various embodiments, through substrate vias range in diameter from about 5 to about 100 µm wide.

Figure 1B:
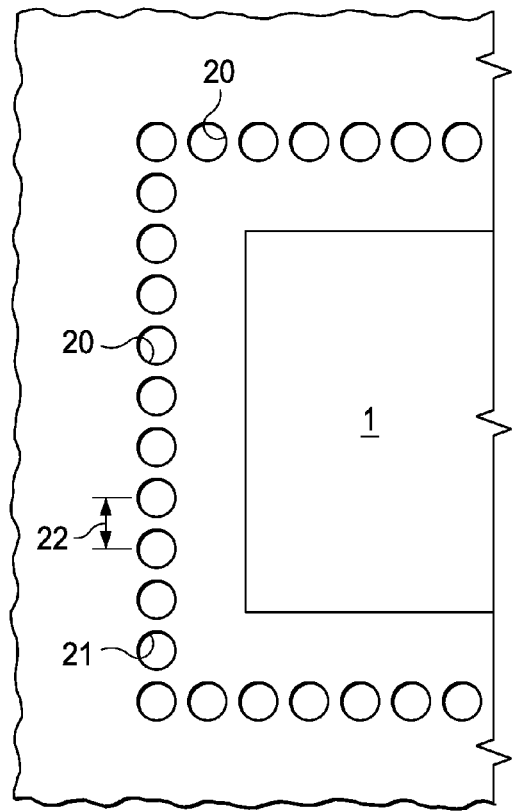

In one embodiment, the through substrate vias 21 are wider and about 20 to about 100 µm wide with aspect ratio's in the range of about 3:1 to about 5:1 (FIG. 1a). In another embodiment, the dimensions of the through substrate vias 21 are smaller and about 5 to about 20 µm wide, and comprise aspect ratios of about 5:1 to about 10:1 (FIG. 1b). In various embodiments, the through substrate vias 21 are formed from either the top or bottom surface of the substrate.

Figure 1C:
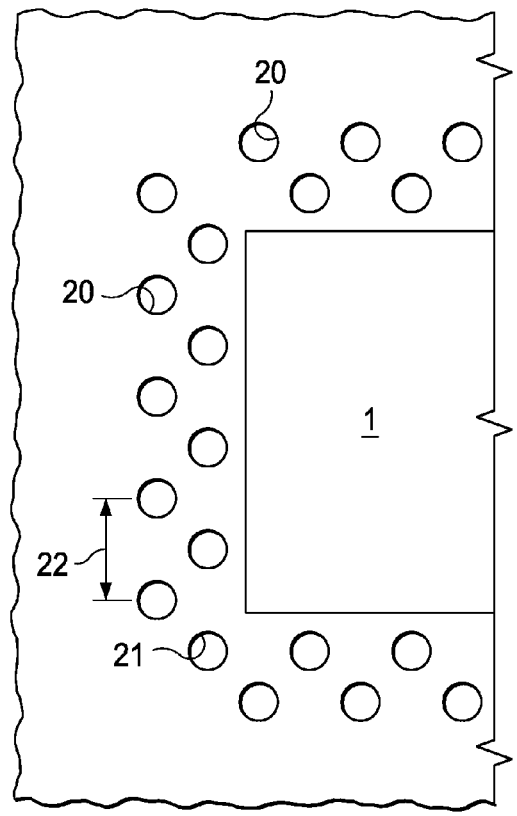
Figure 1D:
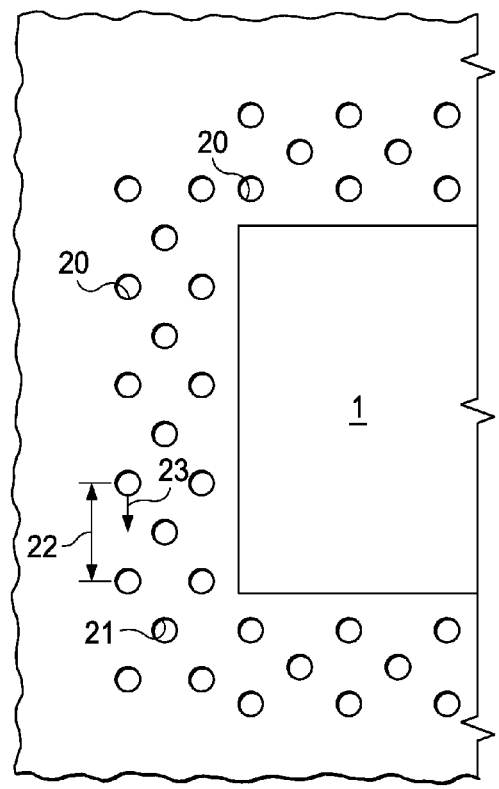
Figure 1E:
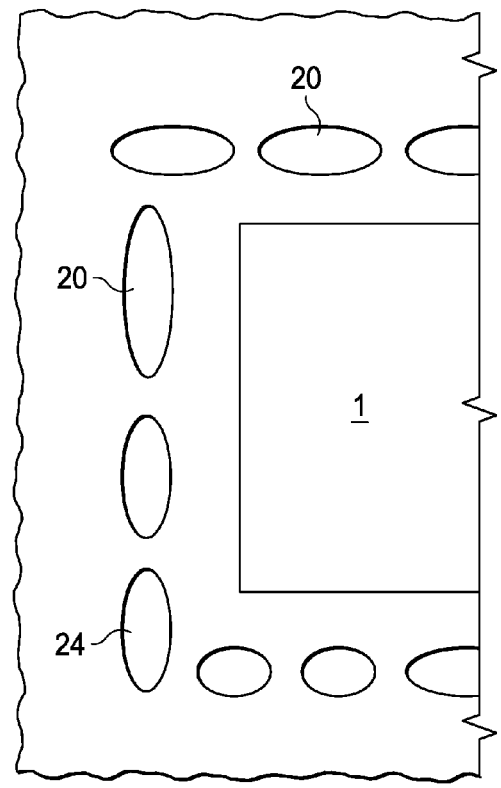

Referring to FIGS. 1c and 1d, in other embodiments, the through substrate vias 21 are disposed in multiple rows and/or columns. In one embodiment, smaller through substrate vias 21 are arranged in rows, with each row staggered relative to a neighboring row. For example, three rows of through substrate vias 21 are used, each adjacent row is displaced by about half pitch (or half the distance between the through substrate vias 21 in a single row). As illustrated in FIG. 1e, in some embodiments, the through substrate vias 21 may comprise other suitable shapes such as an oval.

Figure 1F:
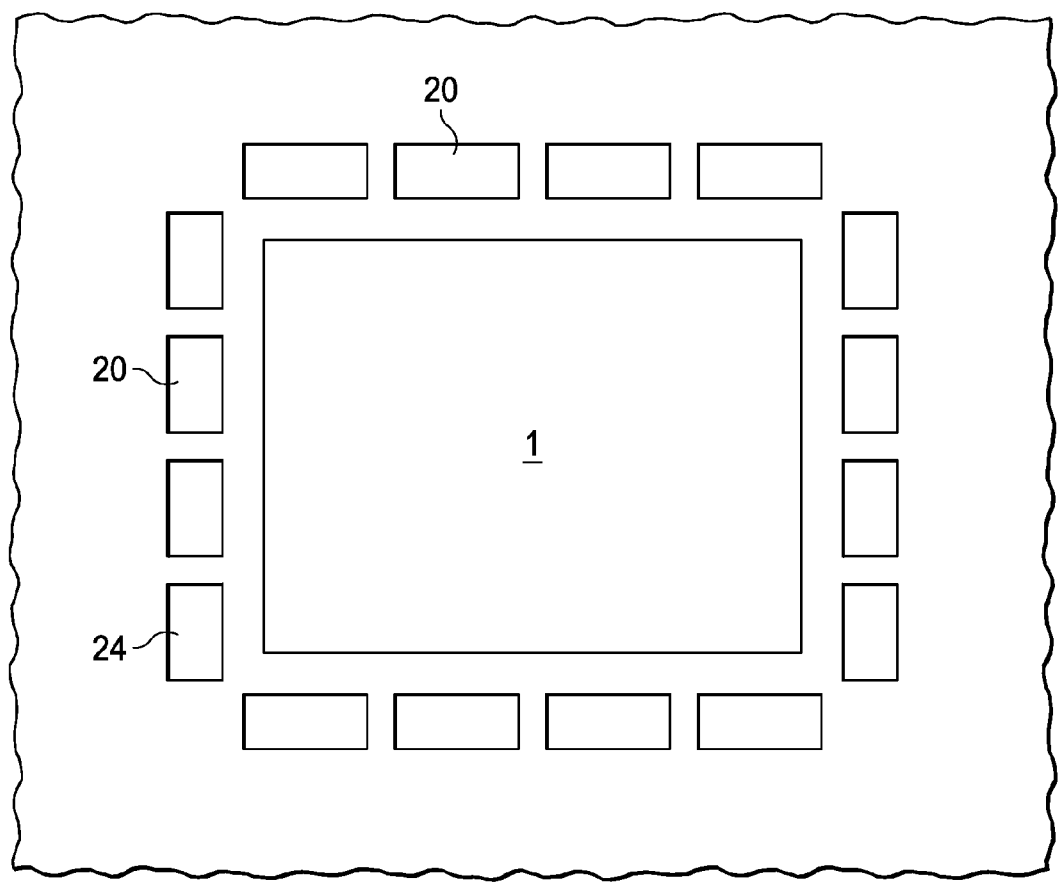
Figure 1G:
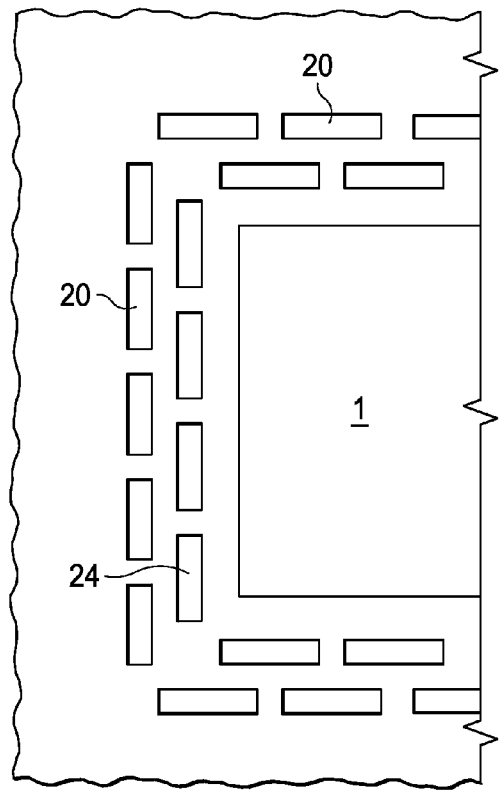
Figure 1H:
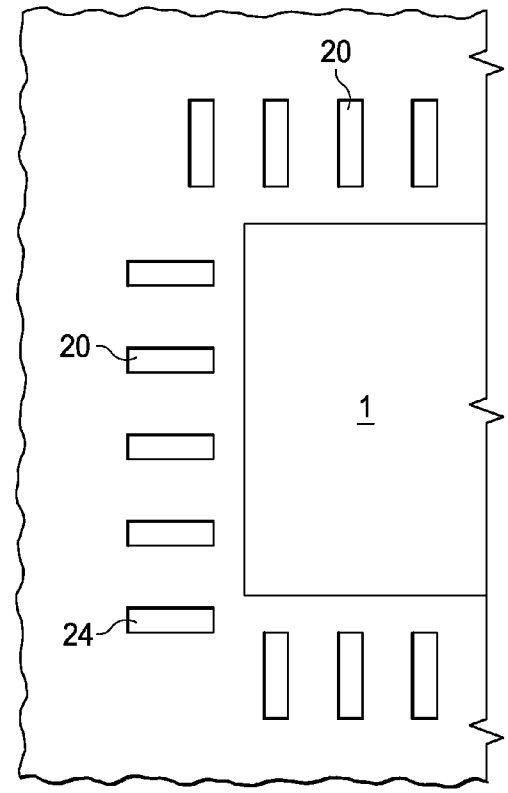

The fence 20 in one embodiment may be formed as through substrate trenches 24 (FIG. 1f). The through substrate trenches 24 may also be staggered in multiple rows. FIG. 1g shows an embodiment with two rows of through substrate trenches 24, although in other embodiments more numbers of rows may be used for improved shielding of the electromagnetic radiation.

In some embodiments, redistribution lines provide connections (not illustrated) coupling the front side circuitry to other components of the chip using the through substrate conductors 25.

FIG. 2 illustrates vertical cross-sectional views of a through substrate via fabricated in accordance with embodiments of the invention.

Figure 2A:
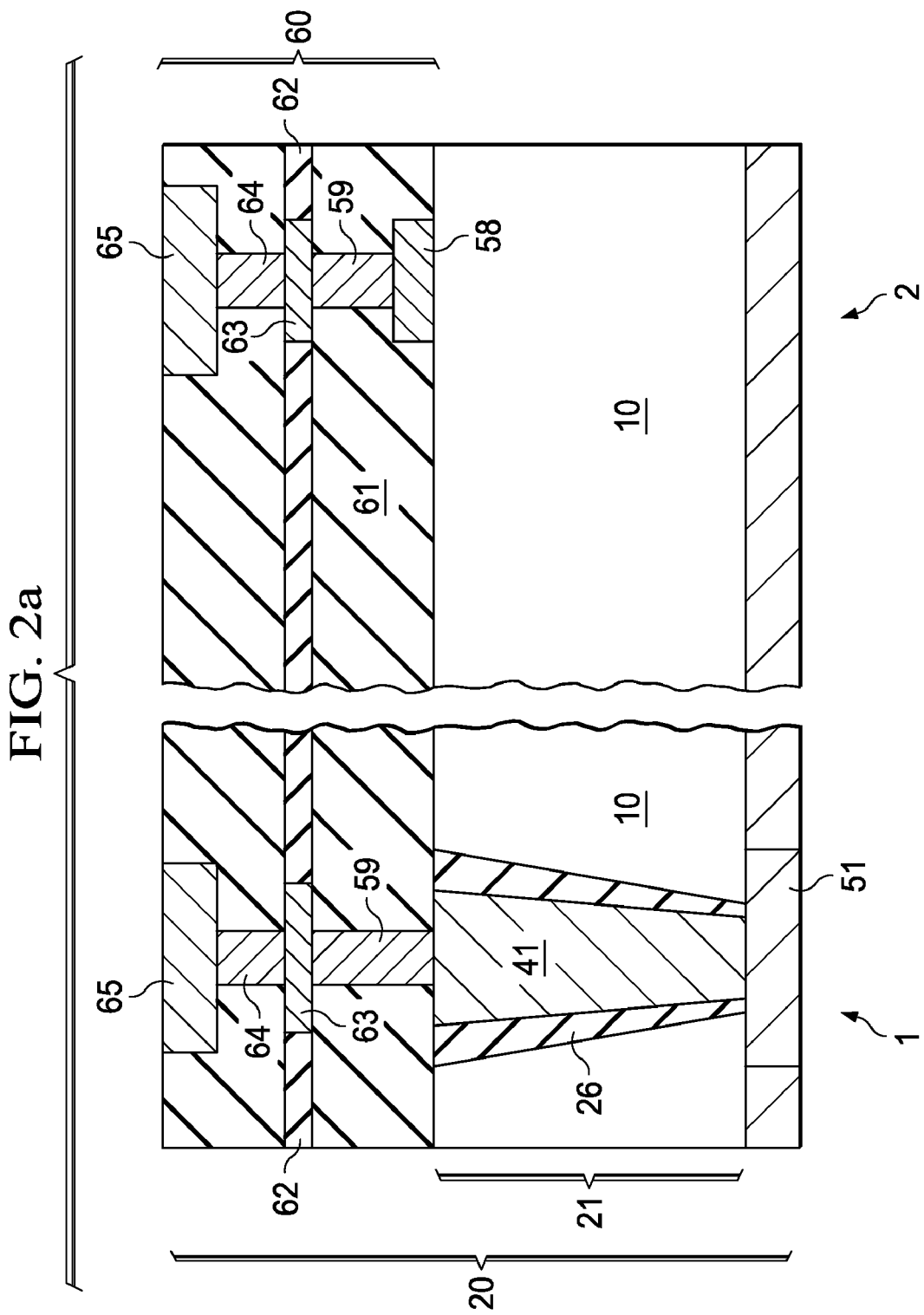
FIGS. 2a and 2b, illustrates a cross-section of a through substrate conductor formed in accordance with embodiments of the invention.

Referring to FIG. 2a, the through substrate via 21 is disposed between an RF component 1 comprising RF circuitry, and another component, for example, a digital logic component 2. The through substrate via 21 is part of the vertical fence 20 shielding the digital logic component 2 from the RF component 1. Both the RF component 1 and the digital logic component 2 are disposed in the substrate 10.

Interconnect layers 60 are disposed above the substrate 10 and comprise the metallization levels that interconnect the circuit. For clarity, the metallization levels on the interconnect layer 60 are illustrated in regions 2.

The substrate 10 in various embodiments comprises a bulk mono-crystalline silicon substrate (or a layer grown thereon or otherwise formed therein), a layer of (110) silicon on a (100) silicon wafer, or a germanium-on-insulator (GeOI) wafer. In other embodiments, other semiconductors such as silicon germanium, germanium, gallium arsenide, indium arsenide, indium phosphide, indium gallium arsenide, indium antimonide or others can be used with the wafer. The substrate 10 also includes active components such as transistors or diodes, or passive components such as capacitors, inductors or resistors, among others. Active regions are disposed on a top surface of the substrate and comprise devices such as transistors, resistors, capacitors, diodes, etc. Metallization levels are disposed over the top surface of the substrate 10.

The through substrate via 21 couples to a contact plug 59 disposed above the substrate 10. The contact plug 59 electrically connects to the through substrate via 21. Accordingly, the through substrate via 21 is formed before forming the contact plug 59. In various embodiments, hence, the through substrate via 21 is formed before, during, or after formation of the active devices.

The contact plug 59 is electrically coupled to a ground potential through the interconnect layer 60. In some embodiments, the through substrate via 21 is also electrically connected with other parts of the active circuitry through the contact plug 59. The contact plug 59 couples to the gate electrode 58 over the active devices, whereas over the through substrate via 21 the contact plug couples to the conductive filling of the through substrate via 21.

The contact plug 59 is coupled to upper metallization levels through first metal lines 63. The first metal level comprises first metal lines 63 disposed over the substrate. The first metal lines 63 are disposed over a first metallization insulation layer 61. The first metallization insulation layer 61 is disposed over the substrate and around the contact plug 59 and on top of through substrate via 21. A second metallization insulation layer 62 is disposed over the first metallization insulation layer 61. The first metal lines 63 are embedded in the second metallization insulation layer 62. The interconnect layer 60 further comprises a first via 64 disposed on the first metal lines 63, and a second metal line 65 coupled to the first via 64.

A first conductive layer 41 is disposed in the inner region of the through substrate via 21, and electrically couples the contact plug 59 to the back side of the substrate 10. The first conductive layer 41 comprises copper, although in other embodiments other conductive materials such as doped polysilicon, tungsten, aluminum, silver, gold, nickel, palladium, or a combination thereof are used.

A sidewall dielectric layer 26 is disposed around the through substrate via 21 and electrically isolates the first conductive layer 41. The sidewall dielectric layer 26 is an oxide such as silicon oxide, or a nitride such as silicon nitride, silicon oxynitride, or organic polymer. In some embodiments, the sidewall dielectric layer 26 comprises other low-k or high-k dielectric material. In some embodiments, a trench metal liner is disposed on the sidewalls of the through substrate via 21 over the sidewall dielectric layer 26. The trench metal liner acts as a metal diffusion barrier for the first conductive layer 41. In some embodiments, the trench metal liner also contains a seed layer used during subsequent electroplating processes. In one embodiment, the first conductive layer 41 is lined with a trench metal liner comprising Ta, TaN, TiW, Ti, TiN, Ru, WN, WCN, or combination thereof. The through substrate via 21 is coupled to a back side contact 51. In various embodiments, the back side contact 51 comprises copper, although in some embodiments, the back side contact 51 comprises aluminum. In some embodiments, the back side contact 51 comprises a liner for preventing diffusion of the conductive element from the back side contact 51 into the substrate. In various embodiments, the back side contact 51 is further coupled to a bottom shield (not shown).

Figure 2B:
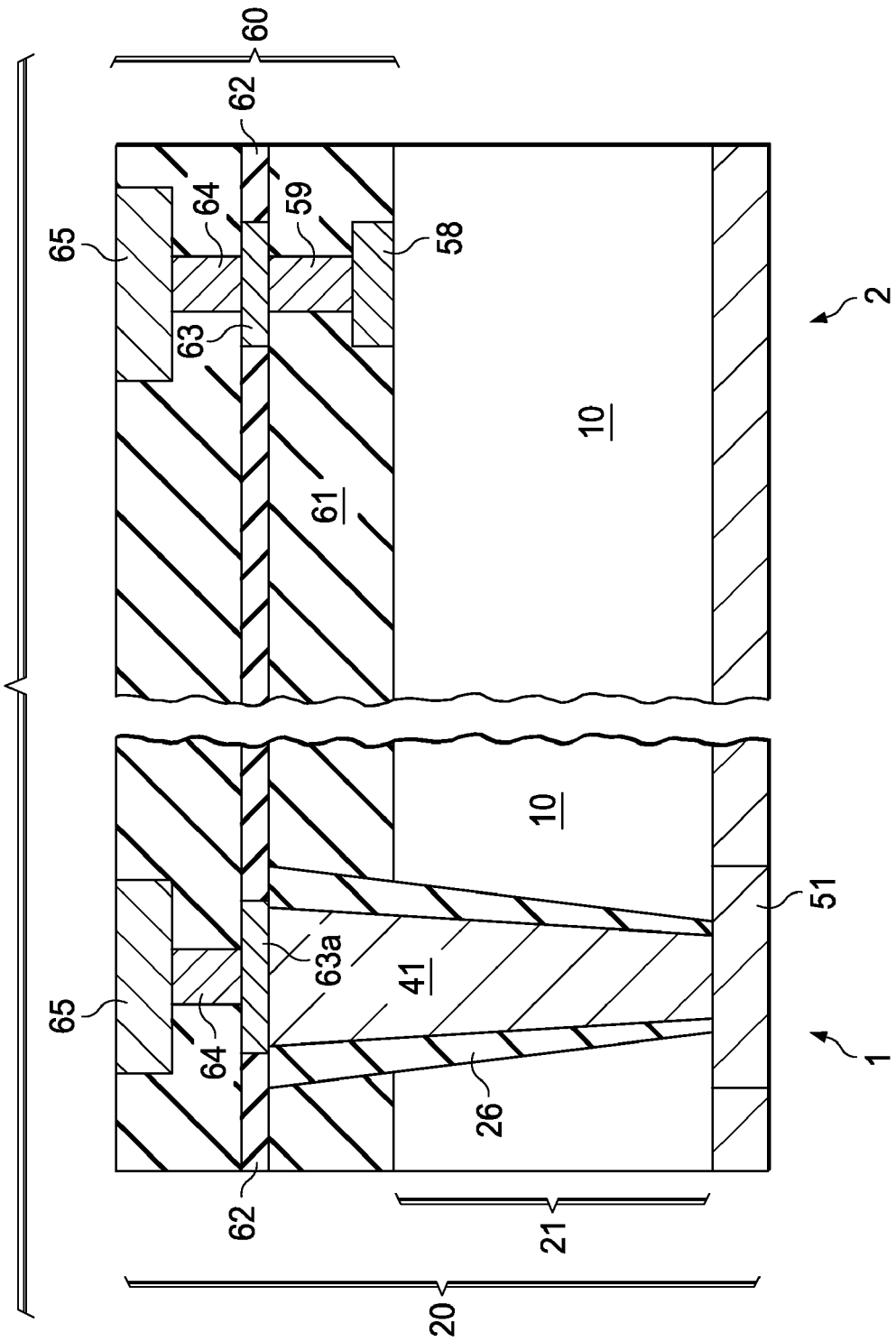

FIG. 2b illustrates an embodiment of the invention, illustrating a through substrate via 21 coupled directly to the first metal level. Unlike the previous embodiment, FIG. 2b illustrates a first conductive layer 41 coupled to the first metal lines 63. Hence, unlike the prior embodiment, the through substrate via 21 is formed after forming the active devices, or at least after the activation of the source and drain regions of the active devices. In various embodiments, the through substrate conductors 25 are formed by etching an opening into the wafer from the top surface before forming all the metallization levels.

Although illustrated in FIG. 2 with a forward tapering sidewall (wider at the top surface of the substrate than the bottom surface of the substrate), the through substrate via 21 in other embodiments may comprise vertical sidewalls or a reverse taper (wider at the bottom surface of the substrate than the top surface of the substrate).

Embodiments of the invention describing methods of fabrication of the RF shield 8 on the system on the chip will be described using FIGS. 3, 5, 7, and 9 and with respect to flow charts of FIGS. 4, 6, 8, and 10. The cross-sections are illustrated at a boundary between an RF component 1 and another component (for example, digital logic component 2).

Figure 3A:
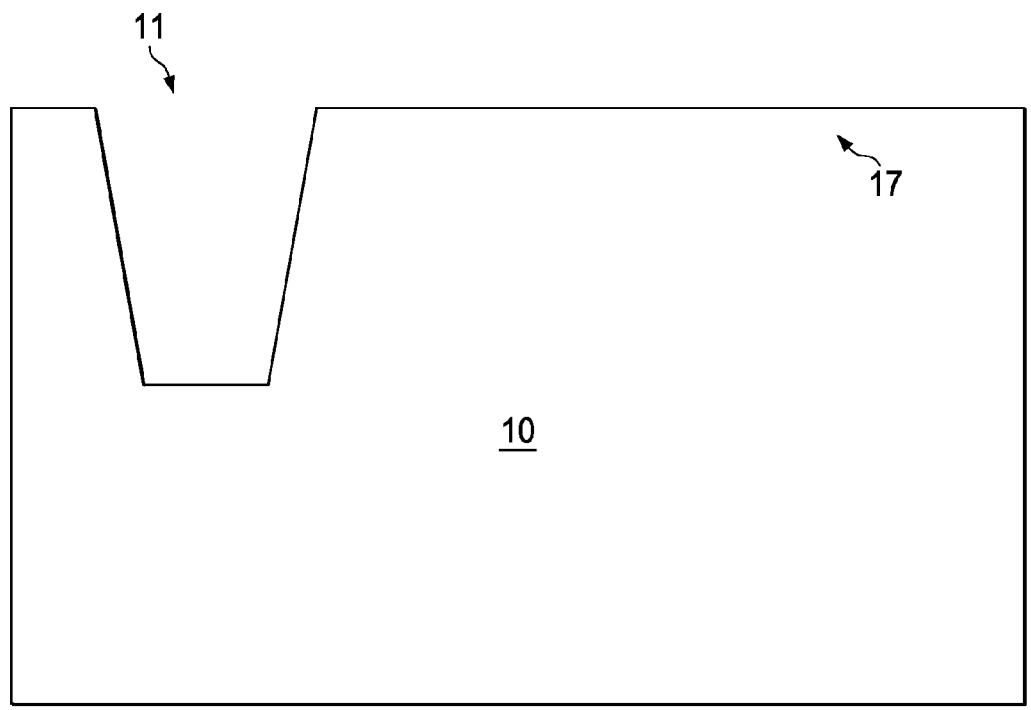
FIGS. 3a-3d, illustrates a cross-section of a through substrate conductor in various stages of fabrication, in accordance with an embodiment of the invention.
Figure 3B:
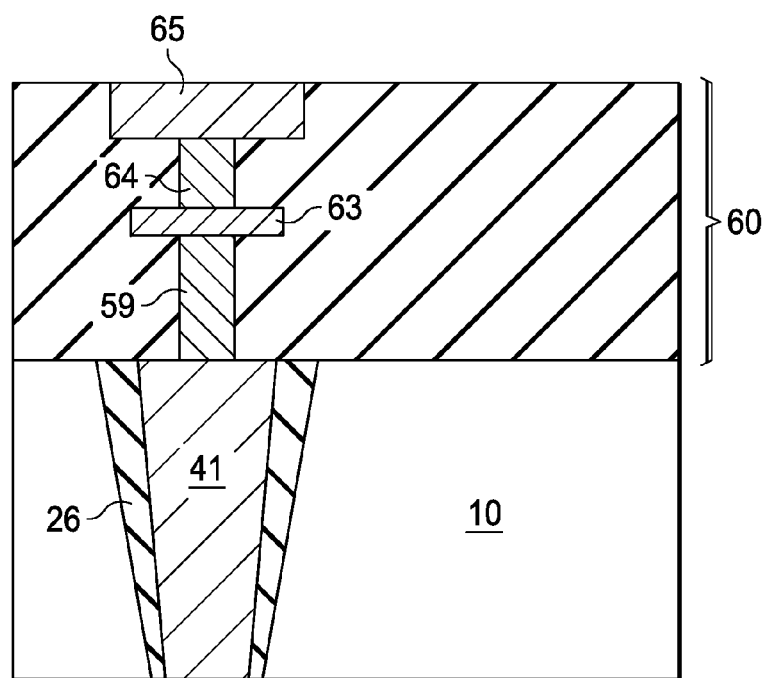
Figure 3C:
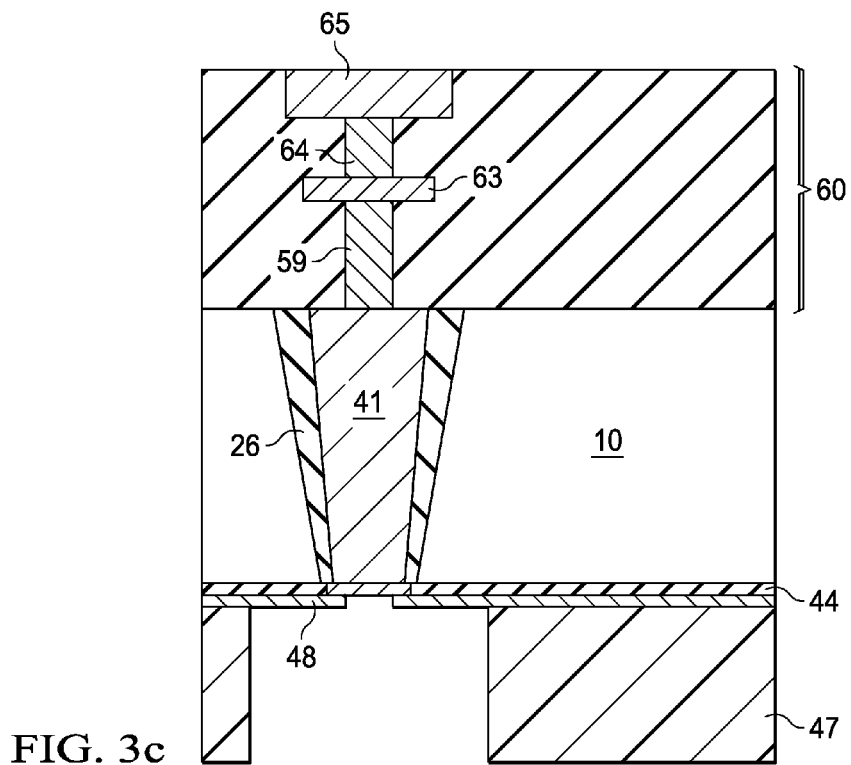
Figure 3D:
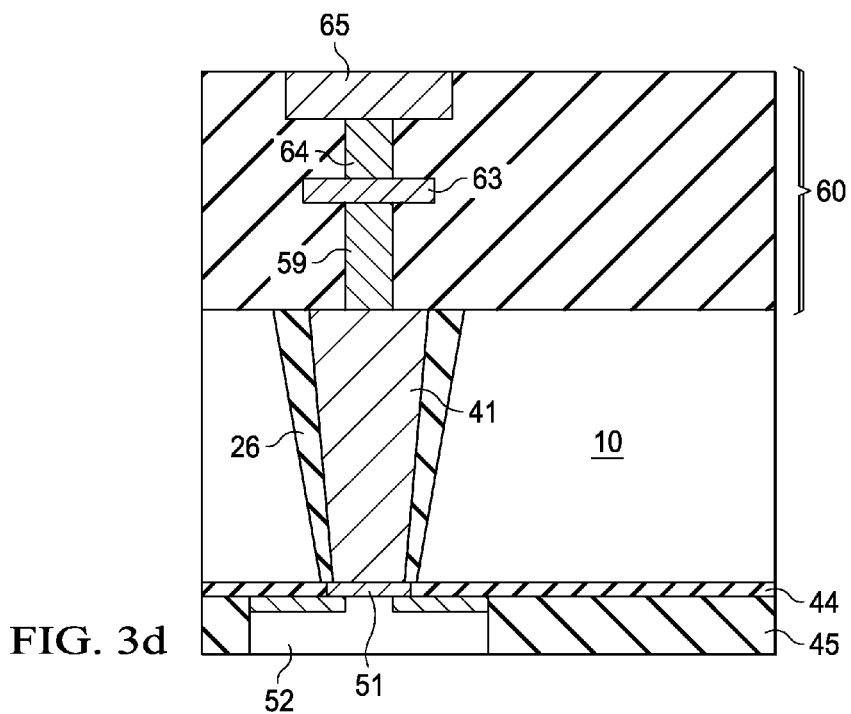
Figure 4:
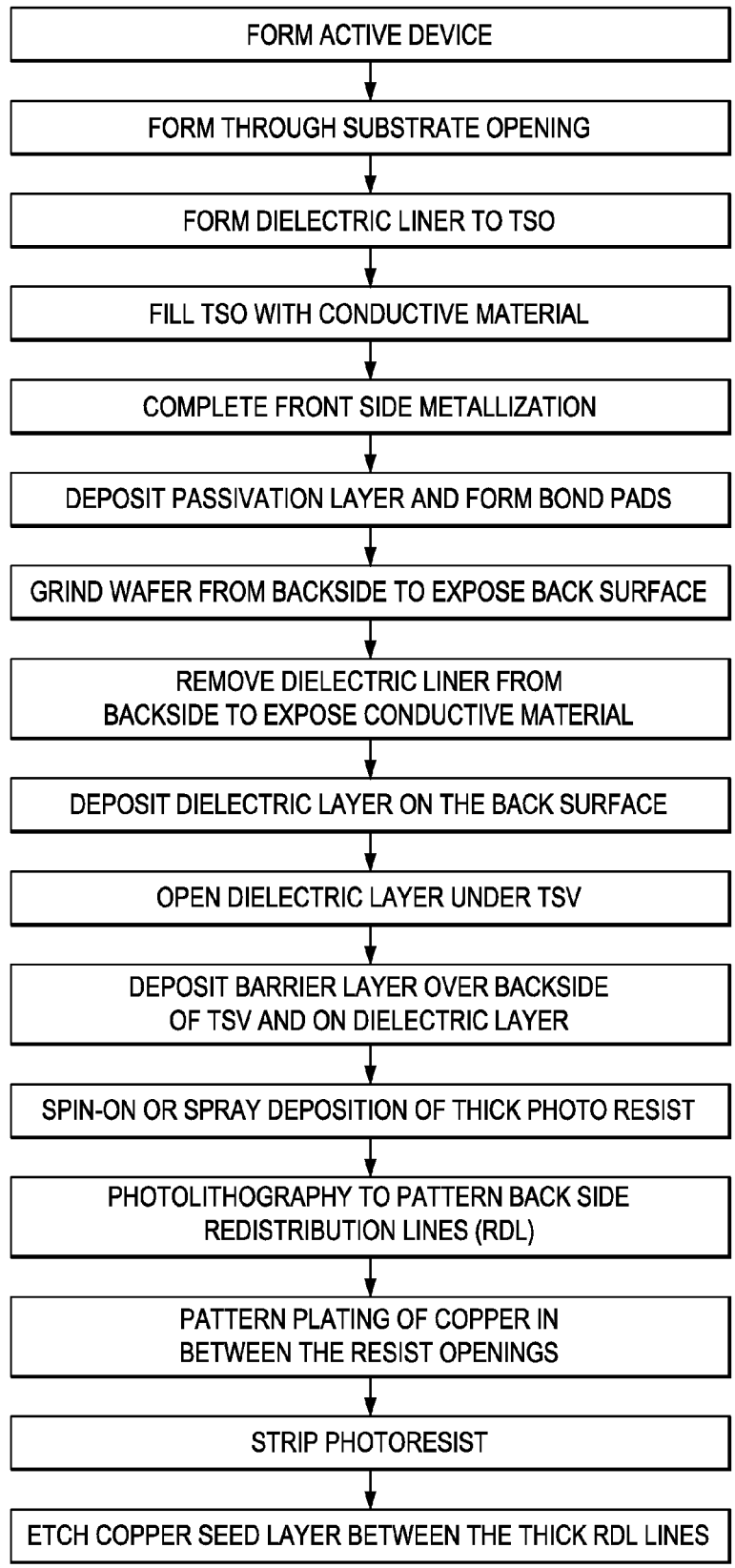
FIG. 4 illustrates a flow chart of the process illustrated in FIG. 3, in accordance with an embodiment of the invention.

An embodiment of the invention is illustrated in FIG. 3, which includes FIGS. 3a-3d, along with the flow chart of FIG. 4. As described with respect to FIG. 3a, and as illustrated in the flow chart of FIG. 4, device regions 17 are formed on a side near a top surface of a substrate 10 during front end processing. The substrate 10 is typically a semiconductor wafer. The device regions 17 or active circuitry includes transistors, resistors, capacitors, inductors or other components used to form the active devices for the RF component and the other component (digital logic component 2).

Next, a first opening 11 is formed inside the substrate 10. The first opening 11 is formed after a masking step and in one embodiment after formation of source and drain of the active devices. Forming the through substrate via 21 after forming source and drain regions is advantageous as it allows performing the high temperature steps (for example, source/drain activation anneal) before performing the metallization steps. Although not shown in some embodiments, the first opening 11 is formed along with the formation of isolation regions (e.g., shallow trench isolations). In those embodiments, the first opening 11 is filled with a dummy material and sealed till after the source and drain regions are formed. The dummy material is subsequently removed to re-form the first opening 11. Similarly, the through substrate via 21 is formed before the metallization lines are formed. This is again advantageous as the metallization does not see the extended thermal budget required to fill and anneal the through substrate via 21.

Referring again to FIG. 3a, a high density plasma process in an RF plasma chamber is used to form a first opening 11. In one embodiment, a highly anisotropic etch is used to form a first opening 11 with a forward taper (top broader than bottom). In other embodiments, other types of reactive ion etch processes may be used, including processes using simultaneous bottom etch and sidewall passivation. In one embodiment, an etch step is carried out using a fluorine based plasma. However, fluorine based etches are isotropic and result in non vertical trench sidewalls. Hence, a deposition step is carried out by introducing a polymer producing gas into the plasma chamber. The polymer producing gas deposits a polymer layer on the exposed sidewalls forming a temporary etch stop layer. The polymer layer is not formed on the exposed bottom surface of the trench due to the high energy of the impinging ions. Any polymer deposited on the bottom surface of the trench is broken up by the high energy of the impinging ions. The through substrate opening etch process is carried out in sequential etch and deposition steps. A vertical trench may thus be produced. For example, the fluorine etch step may comprise an $SF_6$ etchant, whereas the polymer producing gas may comprise $C_4F_8$. The etch and deposit steps may be repeated many times, e.g., about 100 times to about 500 times, to form the first opening 11. In other embodiments, other types of reaction ion etch processes may be used. The first opening 11 after the etch step may comprise any suitable vertical shape such as cylindrical, annular, faceted, scalloped, etc.

The first opening 11 thus produced comprises a high aspect ratio in the range from about 1:5 to about 1:20. The top of the first opening 11 comprises a width of about 2 µm to about 20 µm. The angle of the taper varies such that the bottom width is narrower than the top width, and is in the range from about 90 to about 80 degrees.

As illustrated in FIG. 3b, the first opening 11 is lined with an insulating liner and then filled with a conductive material, and thinned from the back side. A sidewall dielectric layer 26 is formed on the sidewalls of the first opening 11. The sidewall dielectric layer 26 in various embodiments comprises multiple layers. The sidewall dielectric layer 26 electrically insulates the active regions from the through substrate via 1 (to be formed). The sidewall dielectric layer 26 may comprise silicon oxide, silicon nitride, silicon oxynitride, SiC, SiCN, a dense or porous low k or ultra low k dielectric material, an organic material or polymere like parylene, BCB, SiLK or others. In some embodiments, the sidewall dielectric layer 26 is anisotropically etched forming a sidewall spacer. Alternately, as illustrated further in FIG. 3f+g, sidewall dielectric layer 26 is etched after the grinding and thinning processes that expose the bottom surface of the first opening 11.

A trench liner (not shown) comprising one or multiple metal liners is deposited over the sidewall dielectric layer 26. The trench liner is ideally conformal or at least continuous, and may comprise a single layer or layer combination of Ta, TaN, W, WN, WCN, WSi, Ti, TiN, Ru as examples. The trench liner is used, for example, as a barrier layer for preventing metal from diffusing into the underlying substrate 10 and sidewall dielectric layer 26. In the described embodiment, the trench liner comprises first, second, third and fourth metal liners (not shown), although in other embodiments less or more levels of metal liners may be used.

The first metal liner is formed over the sidewall dielectric layer 26. The first metal liner forms a metal diffusion barrier. The first metal liner is formed using a chemical vapor deposition process or a plasma enhanced CVD process or a combination of both, although in other embodiments other processes may be used. In one embodiment, the first metal liner comprises a Ti/TiN layer. For example, a 5-30 nm titanium layer is deposited followed by a deposition of about a 20-100 nm TiN layer.

A second metal liner is formed over the first metal liner. The second metal liner comprises a material with a low resistivity. For example, in one embodiment, the second metal line comprises tungsten. The low resistive metal liner helps to minimize potential drop and hence reduce variations during the electroplating process. The second metal liner is deposited using a chemical vapor deposition process, although in other embodiments, other processes such as plasma vapor deposition may be used. In various embodiments, the second metal liner is deposited to a thickness of about 50 nm to about 150 nm.

A third metal liner comprising a copper barrier is formed over the second liner. The third metal liner is deposited to a thickness of about 100 to about 150 nm. The third metal liner, in various embodiments, comprises a TaN layer followed by a layer of tantalum. In one embodiment, the tantalum nitride layer is deposited to a thickness of about 20-50 nm and the tantalum layer is deposited to a thickness of about 100-150 nm.

A fourth metal liner is deposited over the third metal liner. The fourth metal liner is deposited using a plasma vapor deposition process and forms a seed layer for the electroplating process in some embodiments. The fourth metal liner comprises a thickness of about 200 to about 500 nm. In various embodiments, the fourth metal liner comprises copper. The sidewall of the first opening 11 thus comprises the sidewall dielectric layer 26 and the first, second, third and fourth metal liners. In various embodiments, the fourth metal liner may be deposited conformally or at least continuously using, for example, a metal-organic CVD (MOCVD) process or a PVD process.

A first conductive layer 41 is deposited into the first opening 11. In various embodiments, the first conductive layer 41 is electroplated over the fourth metal liner. The first conductive layer 41 comprises a conductive material, such as copper or alternatively, aluminum, tungsten, silver, gold or doped polysilicon. In various embodiments, the first conductive layer 41 comprises copper.

The top surface of the substrate 10 is planarized. In various embodiments, the planarization process comprises a chemical mechanical polishing (CMP). The CMP process removes the first conductive layer 41 and the underlying trench liner and the sidewall dielectric layer 26 from over the substrate 10. After polishing through the first conductive layer 41, the CMP process removes the first, second, third and fourth metal liners. In various embodiments, the polishing process stops on the sidewall dielectric layer 26. A post CMP clean is next performed to remove any slurry residuals.

As illustrated in the flow chart of FIG. 4, the components formed during the front-end processing are interconnected by back end of line (BEOL) processing. During this process, contacts are made to the semiconductor body and interconnected using metal lines and vias. Next, metallization is formed in the interconnect layer 60 which comprises multiple layers of insulating materials. Modem integrated circuits incorporate many layers of vertically stacked metal lines and vias (multilevel metallization) that interconnect the various components in the chip. For simplicity only the first and second metal levels are illustrated in FIG. 3e. However, more or less number of metal levels may be present in various embodiments.

After forming the metallization levels, the substrate 10 is thinned by grinding from the back side. Referring to the flow chart of FIG. 4, the substrate 10 is thinned exposing a lower surface 18 by grinding to a desired thickness. The typical thickness of the substrate 10 after the thinning is about 5 µm to about 300 µm. In different embodiments, the thinning may also be performed chemically or using a plasma. For example, a modified plasma etch may be used to thin the silicon wafer from the back side. Such techniques have the additional advantage of not damaging the front side. The advantage of thinning the wafer is to shorten the length of the through-vias, which enhances the electric properties and speeds up the via etch processing and creates a via with a relatively vertical sidewall. The thinned substrate 10 may be attached to a suitable carrier for handling.

Referring to FIG. 3c, insulating layers are deposited over the lower surface 18 of the substrate 10 and patterned to open the through substrate via. A second insulating layer 44 is deposited over the lower surface 18 of the wafer. Using a first photolithography process, the second insulating layer 44 is removed exposing the first conductive layer 41.

A barrier liner 48 is deposited on the back side of the substrate 10 over the second insulating layer 44 and the exposed first conductive layer 41. The barrier liner is a diffusion barrier and comprises a conductive material. The barrier liner 48 may comprise a single layer of Ta, TaN, WN, WCN, WSi, Ti, TiN, Ru or combinations as examples. The barrier liner 48 is deposited using, for example, RF magnetron sputtering. The barrier liner 48 also comprises a seed layer if the subsequent processing comprises electroplating. This seed layer may be deposited continuously using for example, an RF magnetron sputtering (PVD) or a metal-organic CVD (MOCVD) process.

A first photo resist layer 47 is spun over the barrier liner 48 and patterned. In various embodiments, the first photo resist layer 47 is a thick layer of photo resist comprising a thickness of several microns. The first photo resist layer 47 is patterned using a photo lithography step. The photo lithography step is performed through a mask with patterns for redistribution lines and through substrate vias 21. The photo lithography step exposes the barrier liner 48 separated by the resist lines.

Back side contact 51 and back side redistribution lines 52 are deposited over the exposed barrier liner 48, using for example, another electroplating process. The electroplating process deposits a conductive metal over the exposed regions of the barrier liner and seedlayer 48 (FIG. 3*l*). The back side contact 51 and back side redistribution lines 52 comprise copper in one embodiment.

As illustrated in FIG. 3*d*, remaining first photo resist layer 47 is stripped to expose the barrier liner 48. The exposed barrier liner and seedlayer 48 is removed by wet or dry etching to expose the underlying second insulating layer 44. A third insulating layer 45 is deposited over the second insulating layer 44 isolating the back side redistribution lines 52.

Figure 5A:
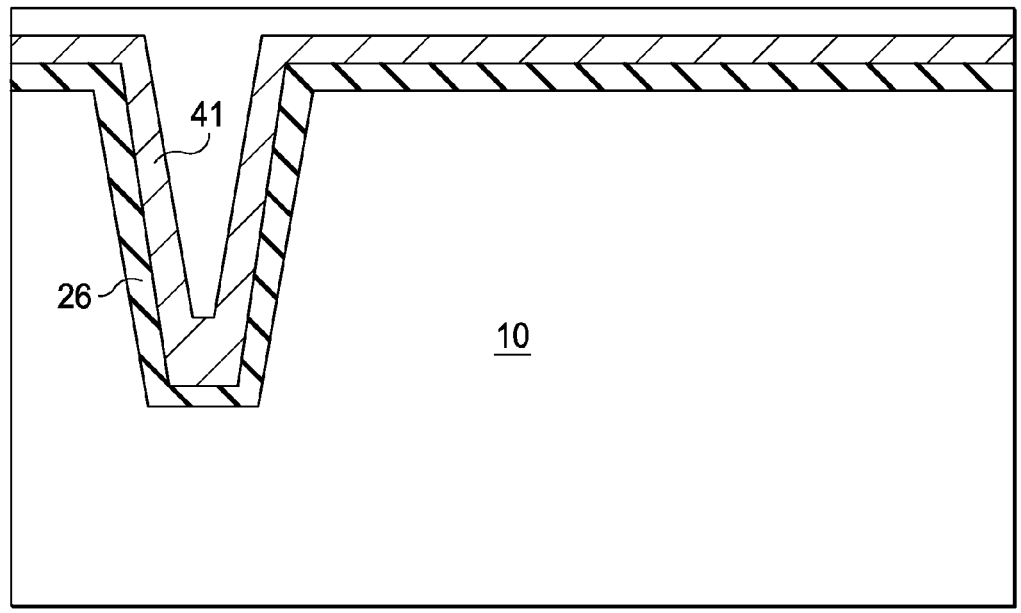
FIGS. 5a and 5b, illustrates a cross-section of a partially filled through substrate conductor in various stages of fabrication, in accordance with an embodiment of the invention.
Figure 5B:
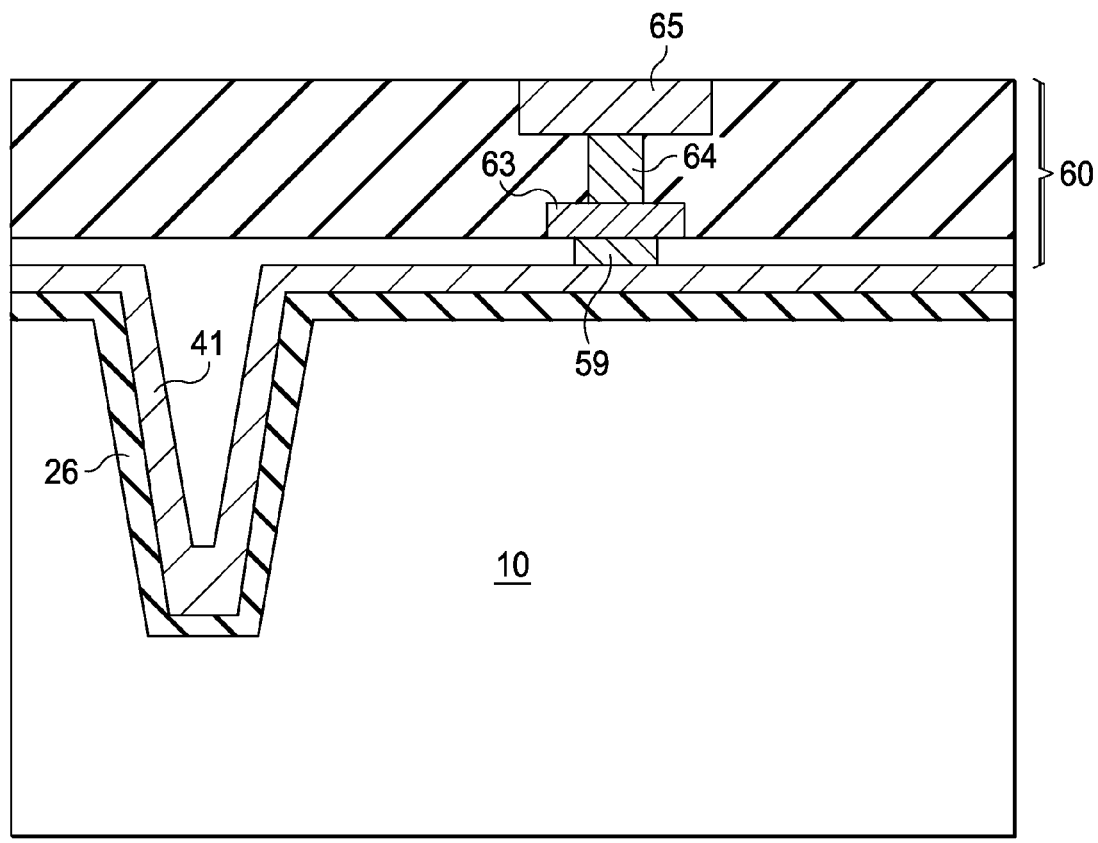
Figure 6:
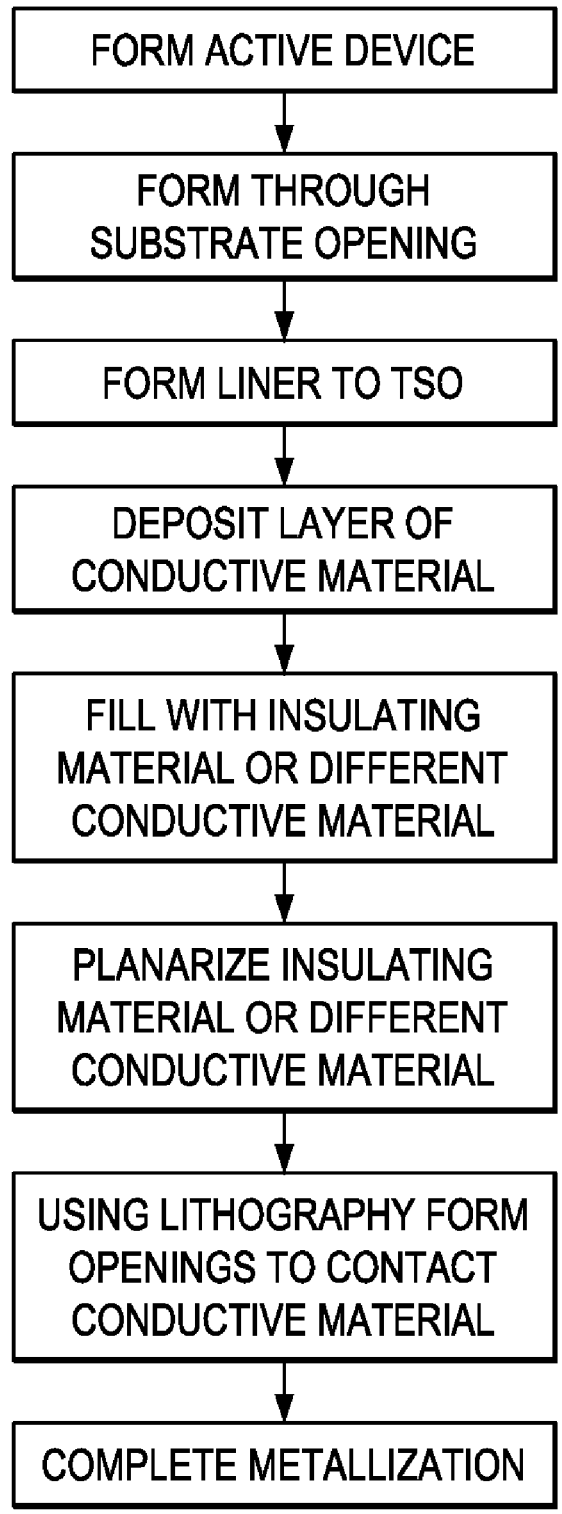
FIG. 6 illustrates a flow chart of the process illustrated in FIG. 5, in accordance with an embodiment of the invention.

An embodiment of the invention is illustrated using a partial fill of the through substrate via 21, using FIG. 5, which includes FIGS. 5*a* and 5*b* and flow chart of FIG. 6.

The embodiment follows the prior embodiment forming the first opening 11 and forming a sidewall dielectric layer 26, as described with respect to FIGS. 3*a* and 3*b*. However, in this embodiment, the first conductive layer 41 is deposited to fill only a part of the first opening 11.

As illustrated in FIG. 5*a*, the first conductive layer 41 is deposited to a thickness of about 20 to about 30% the depth of the first opening 11. A partial fill of the first opening 11 results in reduced fill time, and an increased process throughput. The partial fill also saves the use of the expensive fill material, and the power intensive process of electroplating the first conductive layer 41. The first conductive layer 41 is also deposited over the substrate 10. In some embodiments, the first conductive layer 41 is removed from unwanted regions of the substrate using a photolithography step. Alternately, for materials that are difficult to etch (for example, copper), the photolithography step is performed after the trench liner is deposited. The photolithography opens selected regions for deposition of the first conductive layer 41. An insulating material layer subsequently fills the first opening 11. Using photolithography, an opening for the contact plug 59 is formed. The contact plug 59 couples to the first conductive layer 41 (FIG. 5*b*).

Figure 7A:
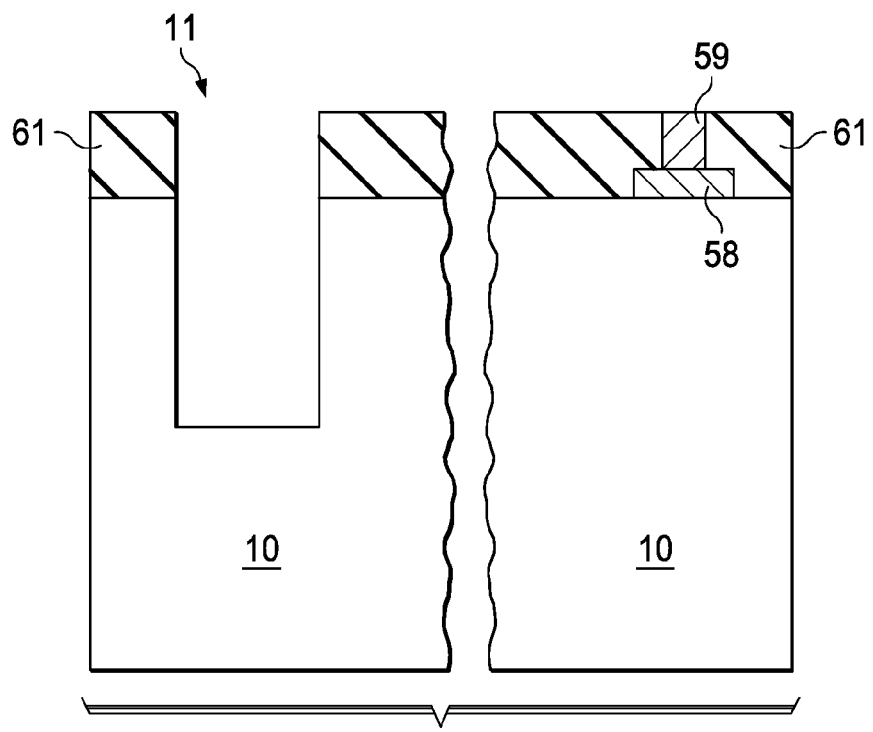
FIGS. 7a-7e, illustrates a cross-section of a through substrate conductor in various stages of fabrication, in accordance with an embodiment of the invention.
Figure 7B:
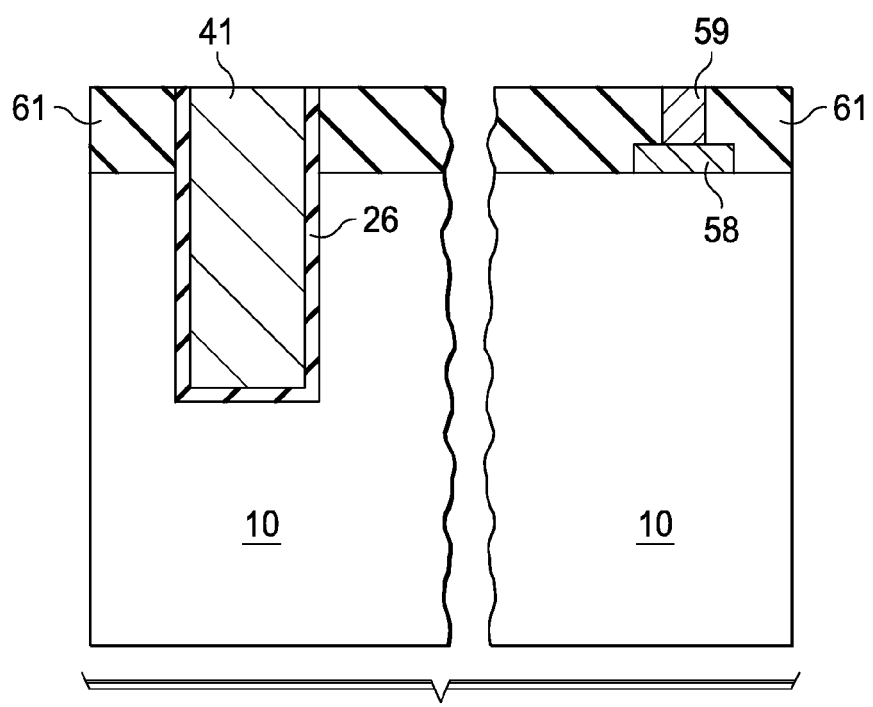
Figure 7C:
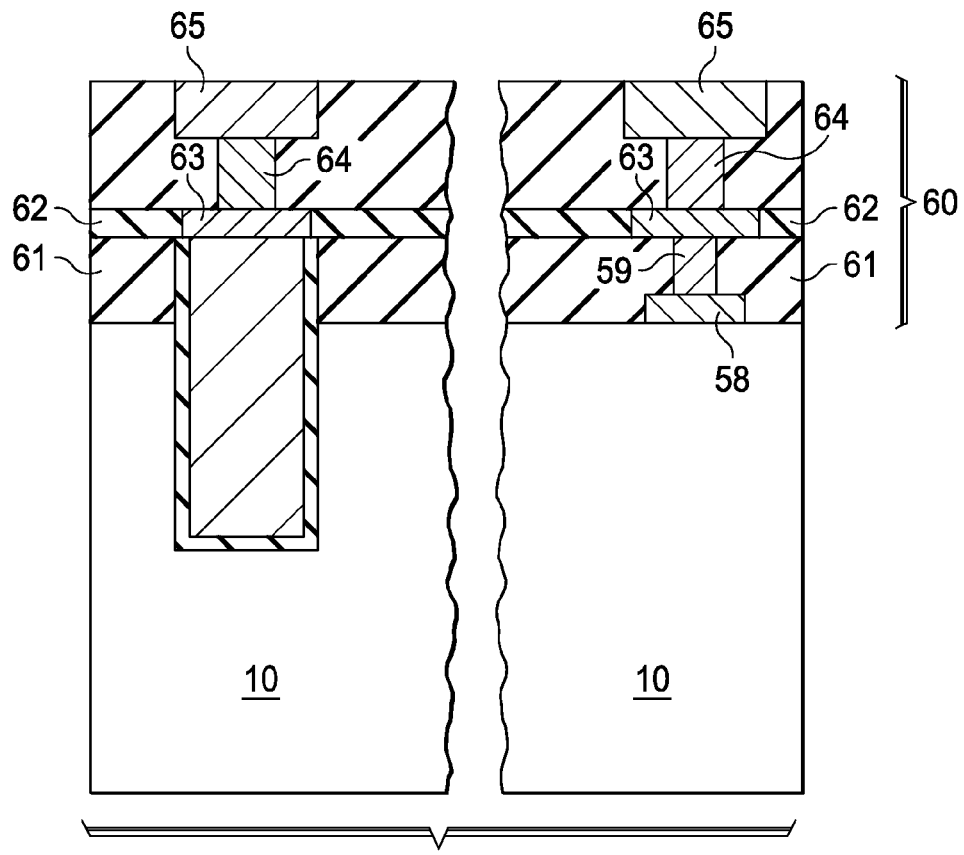
Figure 7D:
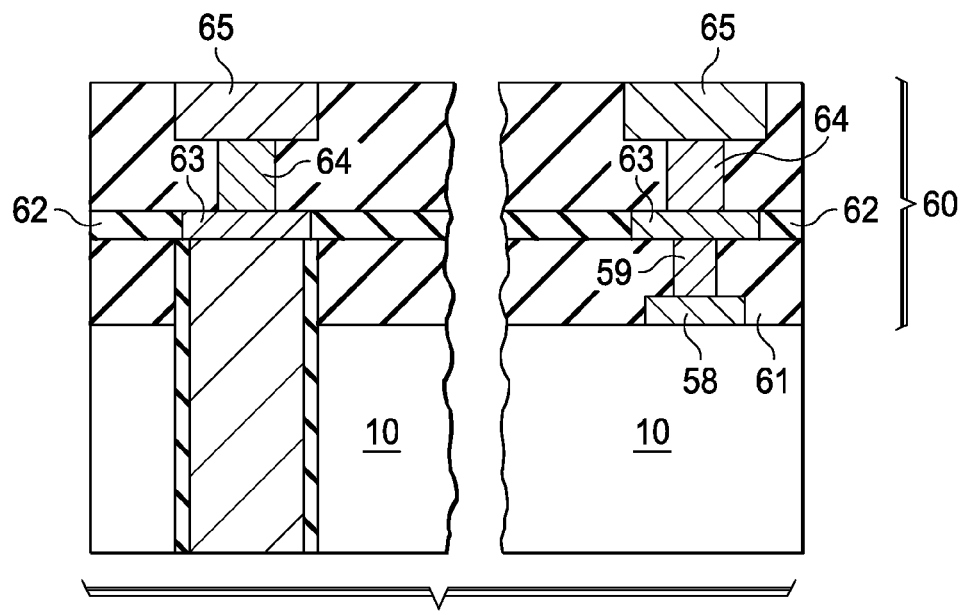
Figure 7E:
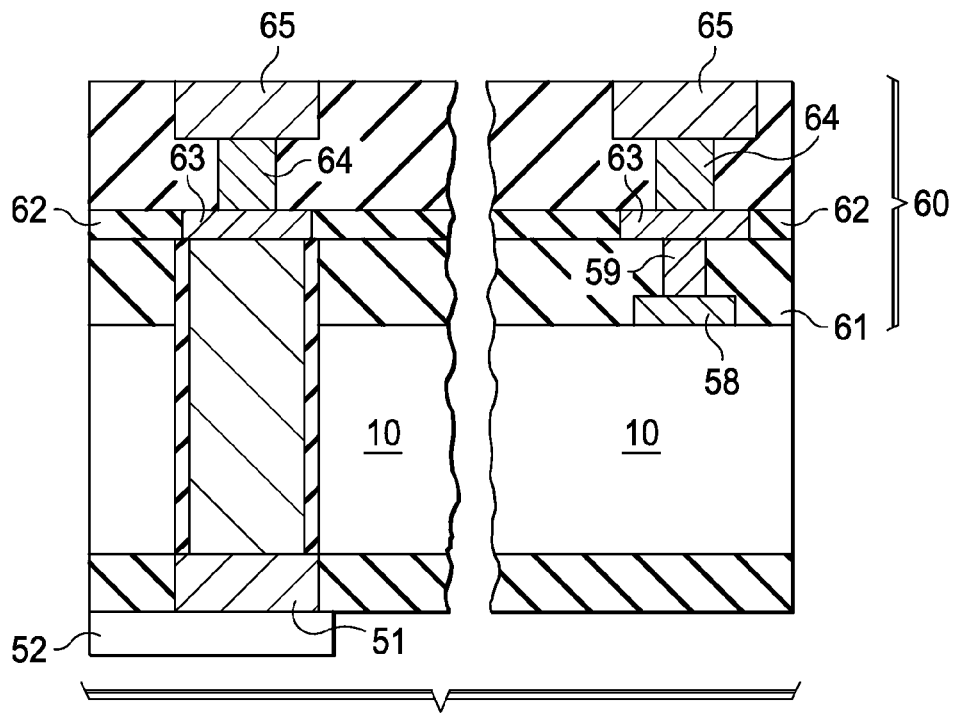
Figure 8:
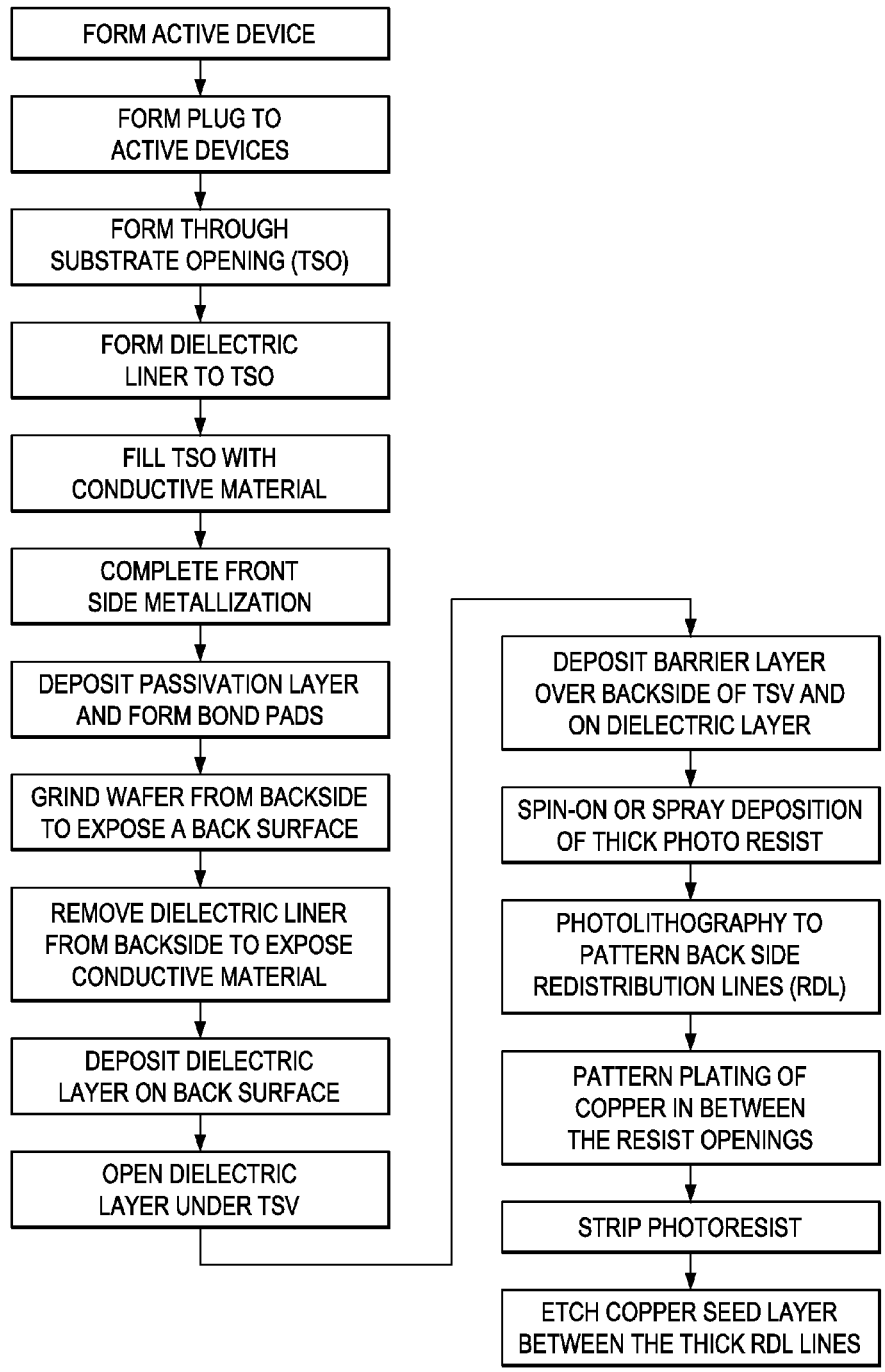
FIG. 8 illustrates a flow chart of the process illustrated in FIG. 7, in accordance with an embodiment of the invention.

FIG. 7, which includes FIGS. 7*a*-7*e*, along with the flow chart of FIG. 8 illustrates an embodiment of the invention wherein the through substrate opening is formed during the back end of the line processing.

The embodiment illustrated in this embodiment differs from the prior embodiment described in FIG. 3, with the placement of forming the opening. Unlike the prior embodiment, the first opening 11 is formed after forming the contact plug 59 (FIG. 7*a*). Hence, the sidewall dielectric layer 26 is formed on the sidewalls of the first metallization insulation layer 61. In various embodiments, the through substrate via 21 is fabricated before the thermally sensitive layers are formed. Hence, the first metallization insulation layer 61 is around the through substrate via 21. Referring next to FIG. 7*b*, the first conductive layer 41 is deposited within the inner region of the through substrate via 21. The first conductive layer 41 comprises copper, although in other embodiments other conductive materials such as doped polysilicon, tungsten, aluminum, silver, gold, nickel, palladium, or combinations thereof are used. The first conductive layer 41 is planarized using, for example, a chemical mechanical planarization.

Subsequent processing follows as in the prior embodiments and is illustrated in FIGS. 7*c*-7*e*. Referring to FIG. 7*c*, a second metallization insulation layer 62 is formed over the first metallization insulation layer 61. First metal lines 63 are formed over the first metallization insulation layer 61. The first metal lines 63 are embedded in the second metallization insulation layer 62. Subsequent metal levels are similarly formed over the first metal level (first metal lines 63). Second metal line 65 coupled to the first via 64 are thus formed over the first metal lines 63.

After forming the metallization levels, the bond pads and passivation layers, the back surface of the wafer is thinned to expose the sidewall dielectric layer 26. The thinning process ends after exposing the first conductive layer 41 (FIG. 7*d*). The back side contact 51 and back side redistribution lines 52 are formed over the exposed first conductive layer 41 using photolithography steps (FIG. 7*e*).

Figure 10:
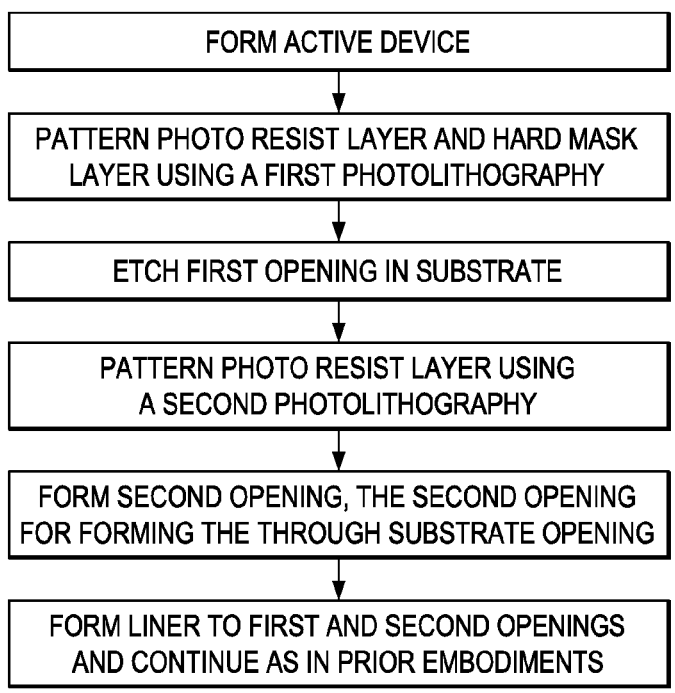
FIG. 10 illustrates a flow chart of the process illustrated in FIG. 9, in accordance with an embodiment of the invention.

An embodiment of the invention comprising concentric openings forming the through substrate via 21 is described, using FIG. 9, which includes FIGS. 9*a*-9*d* and flow chart of FIG. 10.

Figure 9A:
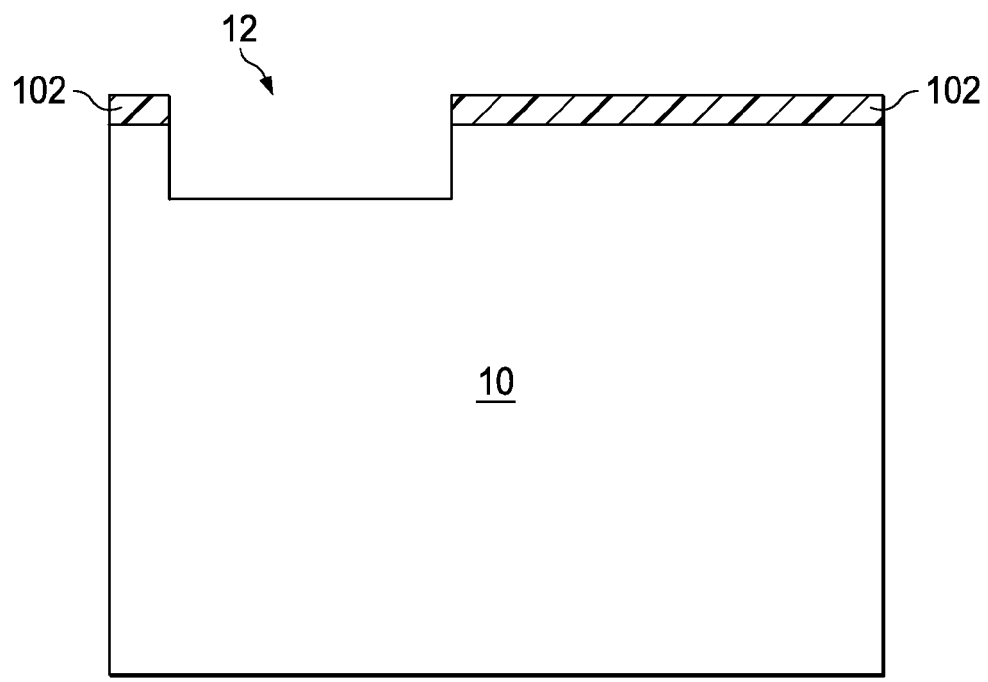
Figure 9B:
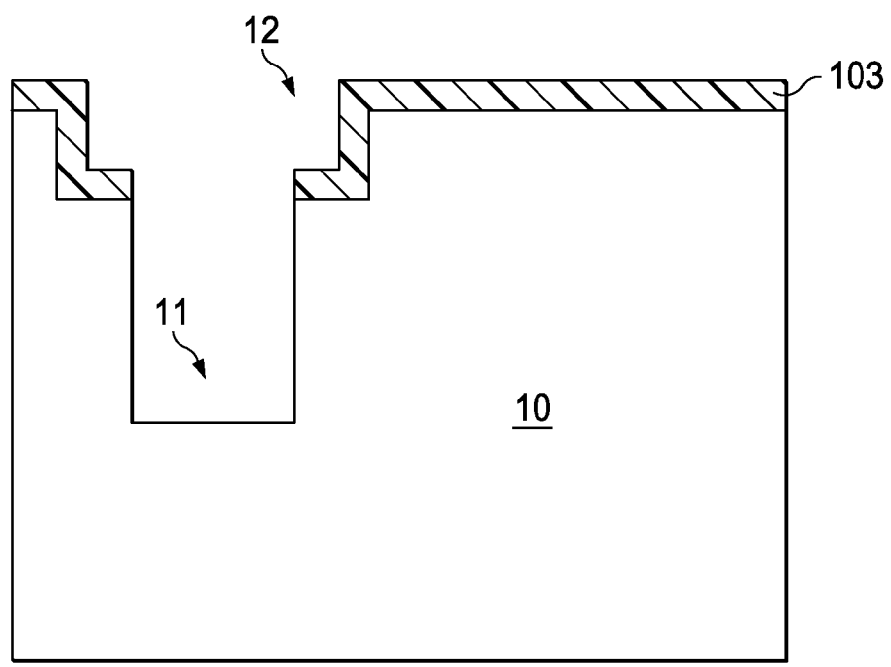

As first illustrated in FIG. 9*a*, a second opening 12 is formed in the substrate 10. The second opening 12 in various embodiments is formed by depositing suitable first mask stack 102 (hard mask and photo resist). The photo resist is patterned and the hard mask etched. Using the patterned first mask stack 102 as a mask, the second opening 12 is etched.

A second mask stack 103 is deposited over the second opening 12. The second mask stack 103 is patterned using a photolithography process. A subsequent reactive ion etching forms the first opening 11 (FIG. 5*b*). The first opening 11 is deeper, but narrower than the second opening 12. Alternately, in some embodiments, the first opening 11 is formed before forming the second opening 12.

Figure 9C:
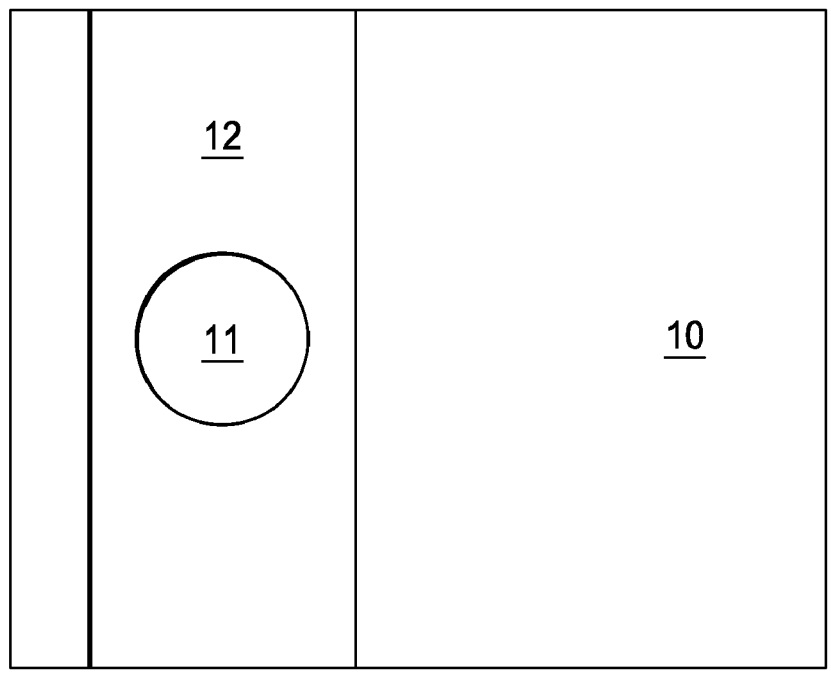
Figure 9D:
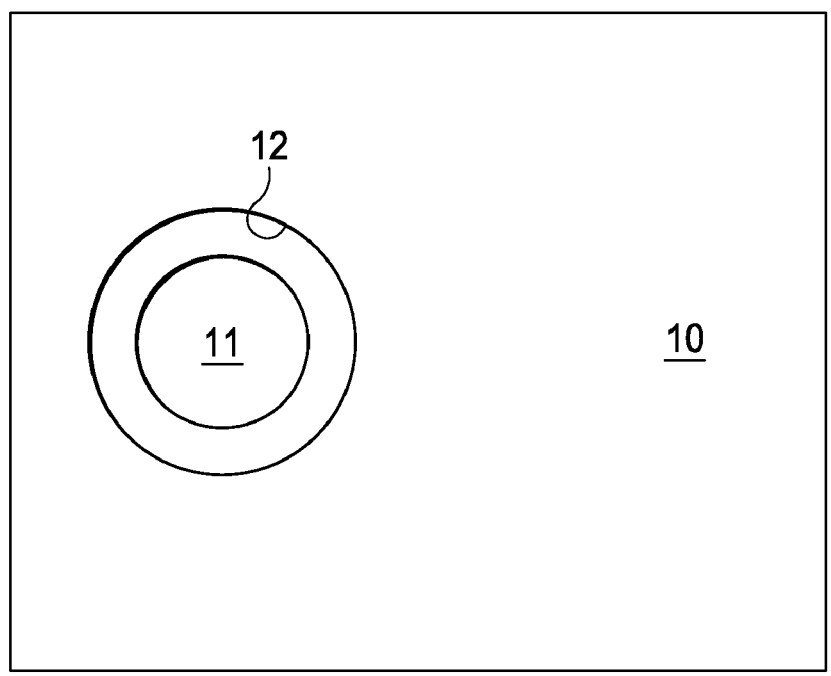

In various embodiments, the second opening 12 comprises a trench or a via. FIGS. 9*c* and 9*d* illustrate a top view of FIG. 9*b* in different embodiments. FIG. 9*c* illustrates one embodiment, wherein the second opening 12 comprises a trench. FIG. 9*d* illustrates an alternate embodiment, wherein the second opening 12 comprises a via. Subsequent processing proceeds as discussed in other embodiments.

In one embodiment the second opening 12 in the Si substrate comprises a trench which connects several or all of the first openings 11 for the through substrate conductors 21 of the RF shield 8. In one embodiment some of the second openings 12 in the form of a trench in the Si substrate may be used to electrically connect the RF component on a first part of the substrate with the semiconductor component on a second part of the substrate. In this particular embodiment the second opening 12 used for the electrical connection between the RF component and the semiconductor component are routed through openings in the RF shield 8 without making any electrical contact to the RF shield 8.

Figure 11A:
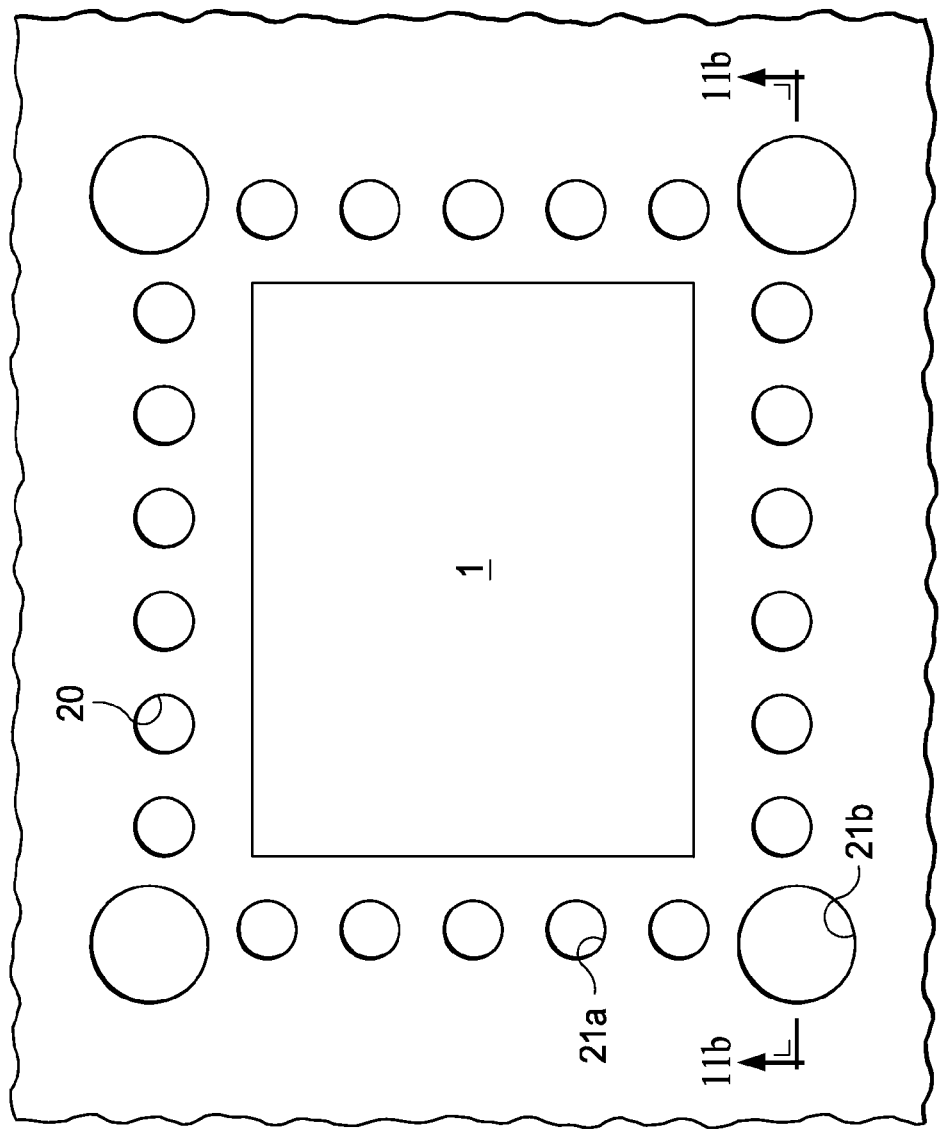
Figure 11B:
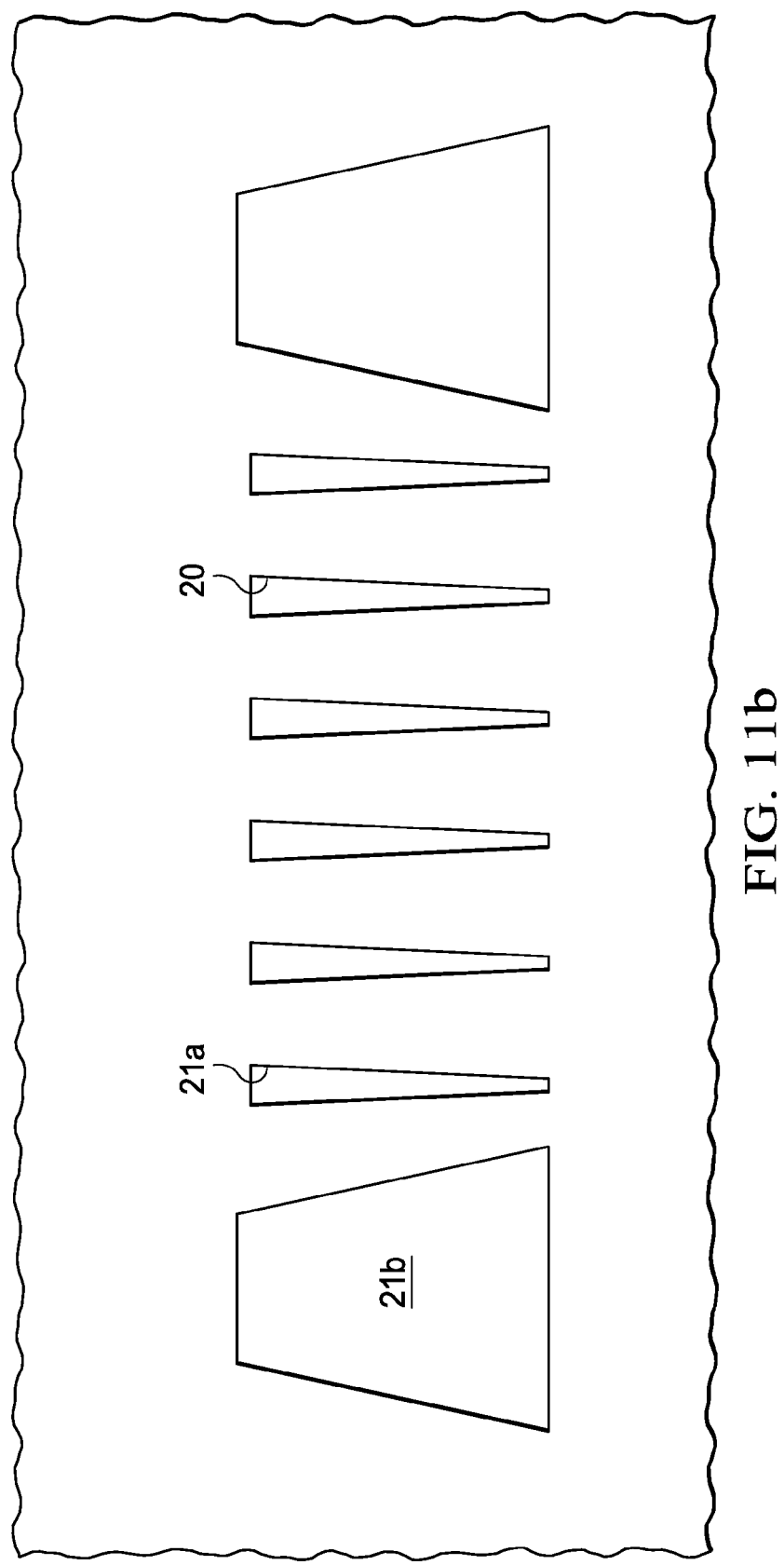

A structural embodiment of the invention is described using FIG. 11, which includes FIGS. 11*a* and 11*b*. FIG. 11*a* illustrates a top view of the through substrate vias and FIG. 11*b* illustrates a cross-sectional view of the through substrate vias.

As illustrated in FIGS. 11*a* and 11*b*, the through substrate vias 21 are formed as a forward taper through substrate via 21a or a reverse taper through substrate via 21b. The forward taper through substrate via 21a is narrower at the bottom or back surface of the substrate 10, whereas the reverse taper through substrate via 21b is narrower on the top surface of the substrate 10. As noted above in prior embodiments, the top surface of the substrate 10 comprises the active devices. The forward taper through substrate via 21a is formed using various embodiments described in the present disclosure wherein the first opening 11 is formed from the top surface. The reverse taper through substrate via 21b is formed by etching a through substrate opening from the back surface of the substrate 10 after forming the active devices and the metallization layers over the substrate.

As illustrated in FIG. 11b, forward taper through substrate via 21a and the reverse taper through substrate via 21b can be arranged together forming a vertical fence 20. In one embodiment, the reverse taper through substrate vias 21b is wider and comprise a smaller aspect ratio than the forward taper through substrate vias 21a. In other embodiments, the forward taper through substrate vias 21a and the reverse taper through substrate vias 21b can be arranged in different patterns to form a more effective RF shield 8 and/or enable better routing, and/or to minimize manufacturing costs.

Although illustrated as a shield against electromagnetic radiation, the structure and methods described in various embodiments can be adopted as a heat spreader for effectively removing heat from individual components. For example, individual components of the SoC 99 are surrounded with through substrate vias 21 as described above in various embodiments, such that the heat produced by the operating devices is efficiently conducted away from the active regions.

Figure 12:
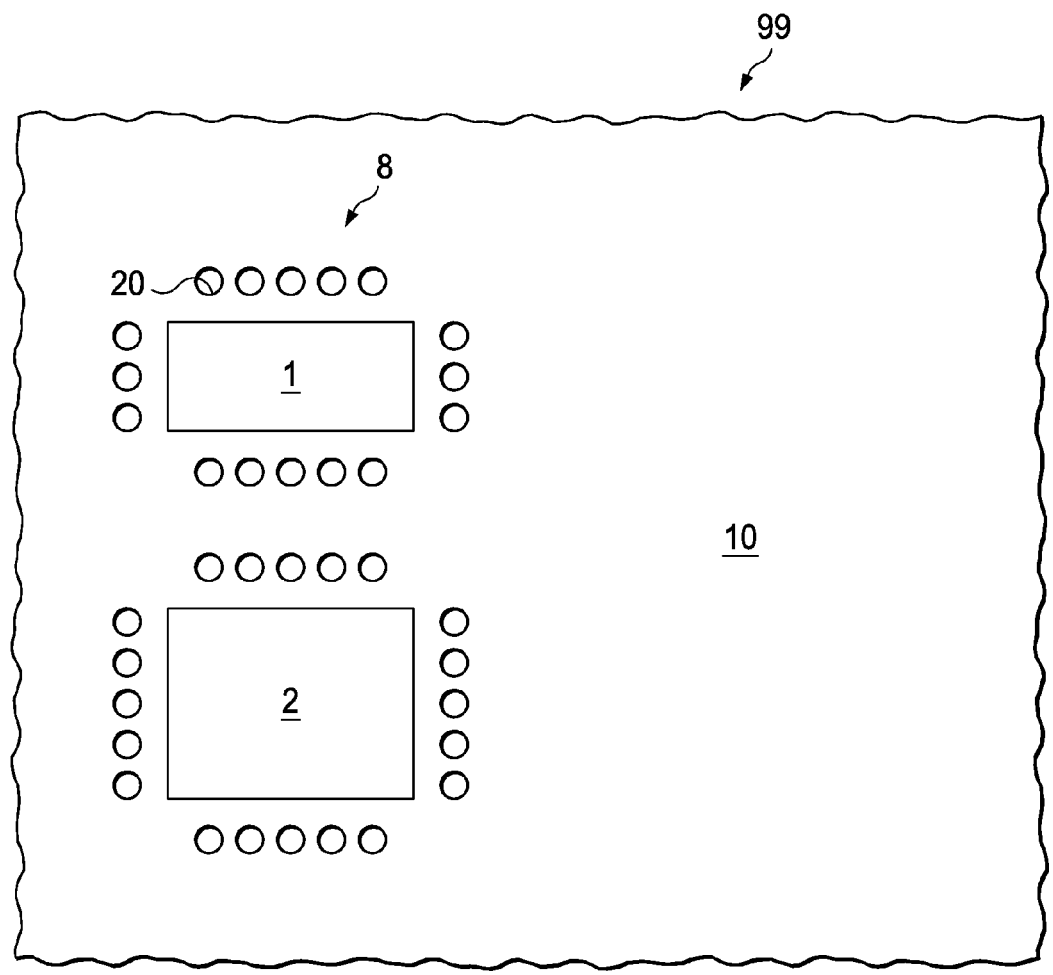
FIG. 12 illustrates an embodiment describing through substrate conductors forming heat sink and an RF shield.

FIG. 12 illustrates an embodiment comprising both an RF shield and a heat sink. As illustrated in FIG. 12, RF shield 8 comprising the through substrate vias 21 surrounds an RF circuit 1. The through substrate vias 21 are also formed around the high performance components that require higher heat dissipation, for example, digital logic component 2. The through substrate vias 21 around the digital logic component 2 form a heat shield that locally removes heat from the digital logic component 2. As the through substrate vias 21 around the digital logic component 2 are not forming an RF shield 8, they do not require coupling to a ground potential or a potential node. In some embodiments, the through substrate vias 21 used for the RF shield 8 and the heat sink are fabricated in different structures. For example, in one embodiment, the through substrate via 21 for the heat sink is designed to minimize real estate on the active surface of the substrate 10 while maximizing the heat transfer away from the active surface. Hence, in one embodiment, the through substrate vias 21 forming the heat sink comprise a pyramidal or conical shape (via opening formed from the back side), for example, a reverse taper through substrate via 21b as illustrated in FIG. 11b.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor chip comprising:
   a first semiconductor component disposed on a first part of a substrate;
   a second semiconductor component disposed on a second part of the substrate, the semiconductor component and the first semiconductor component sharing a common boundary;
   through substrate conductors disposed in the substrate along the boundary and forming a fence around the first semiconductor component, wherein the through substrate conductors are discontinuous along an edge of the first semiconductor component in a direction parallel to a major surface of the substrate, and wherein the through substrate conductors are arranged in a staggered formation in multiple rows around the first semiconductor component, wherein each one of the through substrate conductors comprises a shallow cylinder near the top surface of the substrate and a deep cylinder extending through the substrate, the top surface comprising active devices, wherein the shallow and deep cylinders are concentric; and
   a ground potential node coupled to the through substrate conductors.

2. The semiconductor chip of claim 1, wherein the first semiconductor component comprises a radio frequency component.

3. The semiconductor chip of claim 1, wherein the through substrate conductors are lined with a dielectric liner and filled with a conductive material.

4. The semiconductor chip of claim 3, wherein the conductive material comprises a metal selected from a group consisting of copper, gold, silver, aluminum, tungsten, polysilicon and combinations thereof.

5. The semiconductor chip of claim 1, wherein a longer side of the through substrate conductors is aligned along the edge of the first semiconductor component.

6. The semiconductor chip of claim 1, wherein the through substrate conductors are staggered between the multiple rows.

7. The semiconductor chip of claim 1, wherein the through substrate conductors are spaced apart by a distance of less than about 300 μm.

8. The semiconductor chip of claim 1, wherein the through substrate conductors comprise vias or trenches.

9. A semiconductor chip comprising:
   a first semiconductor component disposed on a first part of a substrate;
   a second semiconductor component disposed on a second part of the substrate, the semiconductor component and the first semiconductor component sharing a common boundary;
   through substrate conductors disposed in the substrate along the boundary and foaming a fence around the first semiconductor component, wherein the through substrate conductors are discontinuous along an edge of the first semiconductor component in a direction parallel to a major surface of the substrate, and wherein the through substrate conductors are arranged in a staggered formation in multiple rows around the first semiconductor component, wherein a width of the through substrate conductors is larger near a top surface of the substrate than a width of the through substrate conductors on a bottom surface, the top surface comprising active devices and being opposite the bottom surface;

a ground potential node coupled to the through substrate conductors; and another through substrate conductor, wherein a width of the another through substrate conductor is smaller near the top surface of the substrate than a width of the another through substrate conductor on the bottom surface.

10. The semiconductor chip of claim 9, wherein each one of the through substrate conductors comprises a trench disposed adjacent the top surface of the substrate and a deep cylinder disposed within the trench, the deep cylinder extending from the top surface to an opposite bottom surface.

11. The semiconductor chip of claim 10, wherein the trench of each of the through substrate conductors is electrically connected to at least one adjacent trench of the through substrate conductors.

12. The semiconductor chip of claim 1, wherein the through substrate conductors are designed to shield the second semiconductor component from electromagnetic radiation emitted by the first semiconductor component.

13. A semiconductor chip comprising:
a first semiconductor component disposed on a first part of a substrate;
a second semiconductor component disposed on a second part of the substrate, the semiconductor component and the first semiconductor component sharing a common boundary;
through substrate conductors disposed in the substrate along the boundary and forming a fence around the first semiconductor component, wherein the through substrate conductors are discontinuous along an edge of the first semiconductor component in a direction parallel to a major surface of the substrate, and wherein the through substrate conductors are arranged in a staggered formation in multiple rows around the first semiconductor component;
additional trenches disposed in the substrate electrically coupling the first semiconductor component with the second semiconductor component through openings between the through substrate conductors, wherein the additional trenches make no connection to the through substrate conductors; and
a ground potential node coupled to the through substrate conductors.

14. The semiconductor chip of claim 1, further comprising back side contacts coupled to the through substrate conductors, the back side contacts disposed on the back side of the substrate.

15. The semiconductor chip of claim 14, wherein the back side contacts are electrically coupled to another semiconductor chip.

16. The semiconductor chip of claim 15, wherein the another semiconductor chip comprises another through substrate conductor, the another through substrate conductor coupled to the through substrate conductors through the back side contacts.

17. A semiconductor chip comprising:
first through substrate conductors disposed around a first circuit disposed on the semiconductor chip, the first through substrate conductors coupled to a ground potential node; and
second through substrate conductors disposed around a second circuit disposed on the semiconductor chip, the second through substrate conductors are electrically floating.

18. The semiconductor chip of claim 17, wherein the first circuit comprises a radio frequency circuit, and the second circuit comprises a high performance circuit.

19. The semiconductor chip of claim 17, wherein the first through substrate conductors are designed to shield the first circuit to and/or from RF radiation and wherein the second through substrate conductors are designed to remove heat generated by the second circuit.

20. The semiconductor chip of claim 17, wherein the first and second through substrate conductors comprise at least one different dimension.

21. A semiconductor chip comprising:
a first circuit disposed in a first region of a substrate, the first circuit being disposed on a top surface of the substrate; and
through substrate conductors disposed in a second region of the substrate, the through substrate conductors disposed around the first circuit, the second region comprising no active devices, wherein the through substrate conductors are designed to remove heat generated by the first circuit.

22. The semiconductor chip of claim 21, wherein the first circuit comprises a high performance circuit.

23. The semiconductor chip of claim 21, wherein the through substrate conductors are electrically floating.

24. The semiconductor chip of claim 21, wherein the through substrate conductors each have a diameter that is wider adjacent the top surface than adjacent a bottom surface of the substrate, the bottom surface being opposite the top surface.

25. A method of forming a semiconductor chip, the method comprising:
forming a through substrate opening from a front surface of a substrate, the through substrate opening disposed between a first and a second region, the first region comprising devices for RF circuitry and the second region comprising devices for other circuitry;
forming the active regions before forming the through substrate opening, the active regions comprising the first region and the second region;
filling the through substrate opening with a conductive material;
forming interconnect layers after forming the through substrate opening, the interconnect layers interconnecting the active regions;
exposing the conductive material in the through substrate opening by thinning the substrate, the back surface being opposite to the front surface; and
electrically coupling the conductive material with a ground potential node.

26. A method of forming a semiconductor chip, the method comprising:
forming a through substrate opening from a front surface of a substrate, the through substrate opening disposed between a first and a second region, the first region comprising devices for RF circuitry and the second region comprising devices for other circuitry;
filling the through substrate opening with a conductive material;

exposing the conductive material in the through substrate opening by thinning the substrate, the back surface being opposite to the front surface;

electrically coupling the conductive material with a ground potential node;

depositing an insulating layer on the back surface;

depositing and patterning a first photo resist layer on the insulating layer, the patterned first photo resist layer exposing a back contact of the through substrate opening;

depositing a conductive liner over the first photo resist layer, the barrier liner contacting the back contact;

depositing and patterning a second photo resist layer on the conductive liner, the patterned second photo resist layer forming patterns for redistribution lines; and forming redistribution lines by filling the patterned second photo resist layer with the conductive material.

27. The method of claim 26, further comprising:

etching portions of the conductive liner not covered by the conductive material; and depositing a passivation dielectric layer between the redistribution lines.

28. The method of claim 26, wherein filling the patterned second photo resist layer with the conductive material comprises filling by electroplating the conductive material.

29. The semiconductor chip of claim 9, wherein the first semiconductor component comprises a radio frequency component.

30. The semiconductor chip of claim 9, wherein the through substrate conductors are lined with a dielectric liner and filled with a conductive material.

31. The semiconductor chip of claim 30, wherein the conductive material comprises a metal selected from a group consisting of copper, gold, silver, aluminum, tungsten, polysilicon and combinations thereof.

32. The semiconductor chip of claim 9, wherein the through substrate conductors are spaced apart by a distance of less than about 300 μm.

33. The semiconductor chip of claim 9, wherein the through substrate conductors are designed to shield the second semiconductor component from electromagnetic radiation emitted by the first semiconductor component.

34. The semiconductor chip of claim 13, wherein the first semiconductor component comprises a radio frequency component.

35. The semiconductor chip of claim 13, wherein the through substrate conductors are lined with a dielectric liner and filled with a conductive material.

36. The semiconductor chip of claim 35, wherein the conductive material comprises a metal selected from a group consisting of copper, gold, silver, aluminum, tungsten, polysilicon and combinations thereof.

37. The semiconductor chip of claim 13, wherein the through substrate conductors are spaced apart by a distance of less than about 300 μm.

38. The semiconductor chip of claim 13, wherein the through substrate conductors comprise vias or trenches.

39. The semiconductor chip of claim 13, wherein the through substrate conductors are designed to shield the second semiconductor component from electromagnetic radiation emitted by the first semiconductor component.

40. The semiconductor chip of claim 13, further comprising back side contacts coupled to the through substrate conductors, the back side contacts disposed on the back side of the substrate.

41. The semiconductor chip of claim 40, wherein the back side contacts are electrically coupled to another semiconductor chip.

42. The semiconductor chip of claim 41, wherein the another semiconductor chip comprises another through substrate conductor, the another through substrate conductor coupled to the through substrate conductors through the back side contacts.

* * * * *

UNITED STATES PATENT AND TRADEMARK OFFICE
CERTIFICATE OF CORRECTION

| | | |
|---|---|---|
| PATENT NO. | : 8,169,059 B2 | Page 1 of 1 |
| APPLICATION NO. | : 12/242521 | |
| DATED | : May 1, 2012 | |
| INVENTOR(S) | : Barth et al. | |

It is certified that error appears in the above-identified patent and that said Letters Patent is hereby corrected as shown below:

In Col. 12, line 63, claim 9, delete "foaming" and insert --forming--.

Signed and Sealed this
Thirteenth Day of November, 2012

David J. Kappos
*Director of the United States Patent and Trademark Office*